United States Patent
Le et al.

(10) Patent No.: US 9,312,240 B2
(45) Date of Patent: *Apr. 12, 2016

(54) SEMICONDUCTOR PACKAGES AND METHODS OF PACKAGING SEMICONDUCTOR DEVICES

(71) Applicant: UNITED TEST AND ASSEMBLY CENTER LTD., Singapore (SG)

(72) Inventors: Kriangsak Sae Le, Bangkok (TH); Chee Kay Chow, Singapore (SG)

(73) Assignee: UTAC HEADQUARTERS PTE. LTD., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/521,481

(22) Filed: Oct. 23, 2014

(65) Prior Publication Data

US 2015/0061101 A1    Mar. 5, 2015

Related U.S. Application Data

(63) Continuation-in-part of application No. 14/257,013, filed on Apr. 21, 2014, now Pat. No. 9,117,808, which is a continuation of application No. 13/360,796, filed on Jan. 29, 2012, now Pat. No. 8,703,534.

(60) Provisional application No. 61/437,685, filed on Jan. 30, 2011.

(51) Int. Cl.
*H01L 21/00* (2006.01)
*H01L 23/02* (2006.01)
(Continued)

(52) U.S. Cl.
CPC .......... *H01L 25/0655* (2013.01); *H01L 21/561* (2013.01); *H01L 23/3135* (2013.01); *H01L 23/49503* (2013.01); *H01L 23/49833* (2013.01); *H01L 24/17* (2013.01); *H01L 24/81* (2013.01); *H01L 24/94* (2013.01); *H01L 24/97* (2013.01); *H01L 25/0652* (2013.01);
(Continued)

(58) Field of Classification Search
CPC ............. H01L 2224/97; H01L 2224/73204; H01L 2224/16; H01L 2224/81; H01L 2225/06517; H01L 25/0657; H01L 2224/16235; H01L 2224/81815
USPC .......... 438/106, 108, 127, 311; 257/686, 698, 257/777, E21.499, E21.502, E21.503, 257/E21.508, E21.511
See application file for complete search history.

(56) References Cited

U.S. PATENT DOCUMENTS

| 5,672,548 A | 9/1997 | Culnane et al. |
| 6,097,098 A | 8/2000 | Ball |

(Continued)

*Primary Examiner* — Mohsen Ahmadi
(74) *Attorney, Agent, or Firm* — Horizon IP Pte. Ltd.

(57) ABSTRACT

A method of forming semiconductor assemblies is disclosed. The method includes providing an interposer with through interposer vias. The interposer includes first and second surfaces. The through interposer vias extend from the first surface to the second surface of the interposer. The interposer with the through interposer vias enable attachment and electrical coupling of a die having very fine contact pitch to an external device having relatively larger contact pitch. At least a first die is mounted on at least one die attach region on the first surface of the interposer. The first die comprises a first surface with first conductive contacts thereon. The interposer comprises material with CTE similar to that of the first die. The first conductive contacts of the first die are coupled to the through interposer vias on the first surface of the interposer. A bonding process which does not require a reflow process is performed to form connections between the first die and interposer.

17 Claims, 38 Drawing Sheets

(51) Int. Cl.
*H01L 25/065* (2006.01)
*H01L 25/00* (2006.01)
*H01L 23/495* (2006.01)
*H01L 23/00* (2006.01)
*H01L 21/56* (2006.01)
*H01L 23/14* (2006.01)
*H01L 23/31* (2006.01)
*H01L 23/498* (2006.01)
*H01L 25/18* (2006.01)

(52) U.S. Cl.
CPC ........... *H01L 25/0657* (2013.01); *H01L 25/50* (2013.01); *H01L 21/563* (2013.01); *H01L 23/147* (2013.01); *H01L 23/3128* (2013.01); *H01L 23/49816* (2013.01); *H01L 23/49827* (2013.01); *H01L 24/06* (2013.01); *H01L 24/16* (2013.01); *H01L 24/73* (2013.01); *H01L 24/83* (2013.01); *H01L 24/92* (2013.01); *H01L 25/18* (2013.01); *H01L 2224/0401* (2013.01); *H01L 2224/06135* (2013.01); *H01L 2224/06181* (2013.01); *H01L 2224/131* (2013.01); *H01L 2224/1403* (2013.01); *H01L 2224/14181* (2013.01); *H01L 2224/16145* (2013.01); *H01L 2224/16225* (2013.01); *H01L 2224/16235* (2013.01); *H01L 2224/1703* (2013.01); *H01L 2224/17181* (2013.01); *H01L 2224/32145* (2013.01); *H01L 2224/32225* (2013.01); *H01L 2224/32245* (2013.01); *H01L 2224/73204* (2013.01); *H01L 2224/73253* (2013.01); *H01L 2224/814* (2013.01); *H01L 2224/81024* (2013.01); *H01L 2224/8191* (2013.01); *H01L 2224/81191* (2013.01); *H01L 2224/81203* (2013.01); *H01L 2224/81424* (2013.01); *H01L 2224/81444* (2013.01); *H01L 2224/81447* (2013.01); *H01L 2224/81455* (2013.01); *H01L 2224/81464* (2013.01); *H01L 2224/81815* (2013.01); *H01L 2224/83102* (2013.01); *H01L 2224/92125* (2013.01); *H01L 2224/94* (2013.01); *H01L 2224/97* (2013.01); *H01L 2225/0652* (2013.01); *H01L 2225/06513* (2013.01); *H01L 2225/06517* (2013.01); *H01L 2225/06541* (2013.01); *H01L 2225/06548* (2013.01); *H01L 2225/06555* (2013.01); *H01L 2225/06568* (2013.01); *H01L 2225/06589* (2013.01); *H01L 2225/1023* (2013.01); *H01L 2225/1058* (2013.01); *H01L 2924/014* (2013.01); *H01L 2924/01005* (2013.01); *H01L 2924/01006* (2013.01); *H01L 2924/01013* (2013.01); *H01L 2924/01029* (2013.01); *H01L 2924/01033* (2013.01); *H01L 2924/01075* (2013.01); *H01L 2924/01079* (2013.01); *H01L 2924/01082* (2013.01); *H01L 2924/157* (2013.01); *H01L 2924/15165* (2013.01); *H01L 2924/15311* (2013.01); *H01L 2924/15331* (2013.01); *H01L 2924/181* (2013.01)

(56) References Cited

U.S. PATENT DOCUMENTS

| | | | |
|---|---|---|---|
| 6,573,609 | B2 | 6/2003 | Fjelstad et al. |
| 7,443,030 | B2 | 10/2008 | Muthukumar et al. |
| 7,772,858 | B2 | 8/2010 | Sasaki et al. |
| 8,104,666 | B1 * | 1/2012 | Hwang ............... B23K 1/0012 228/180.22 |
| 8,115,292 | B2 | 2/2012 | Toh et al. |
| 8,237,274 | B1 * | 8/2012 | Rahman ................. H01L 24/17 257/693 |
| 8,643,167 | B2 | 2/2014 | Hung et al. |
| 2003/0057537 | A1 * | 3/2003 | Iwasaki .................. H01L 23/16 257/684 |
| 2008/0185719 | A1 * | 8/2008 | Cablao ............... H01L 25/0652 257/738 |
| 2008/0283996 | A1 * | 11/2008 | O ........................ H01L 23/5389 257/690 |
| 2009/0146234 | A1 * | 6/2009 | Luo .................. H01L 27/14618 257/432 |
| 2010/0066393 | A1 * | 3/2010 | Bottoms et al. ............... 324/754 |
| 2010/0109142 | A1 * | 5/2010 | Toh ..................... H01L 23/3171 257/690 |
| 2010/0314730 | A1 * | 12/2010 | Labeeb ............... H01L 25/0657 257/676 |
| 2012/0018868 | A1 * | 1/2012 | Oganesian et al. ........... 257/686 |
| 2012/0049079 | A1 * | 3/2012 | Yanoff et al. ............. 250/370.13 |
| 2012/0146241 | A1 * | 6/2012 | Huang .................. H01L 25/105 257/777 |
| 2014/0017852 | A1 | 1/2014 | Kwon et al. |
| 2014/0127838 | A1 | 5/2014 | Huang et al. |
| 2014/0134796 | A1 | 5/2014 | Kelly et al. |
| 2014/0151892 | A1 | 6/2014 | Kang et al. |

* cited by examiner

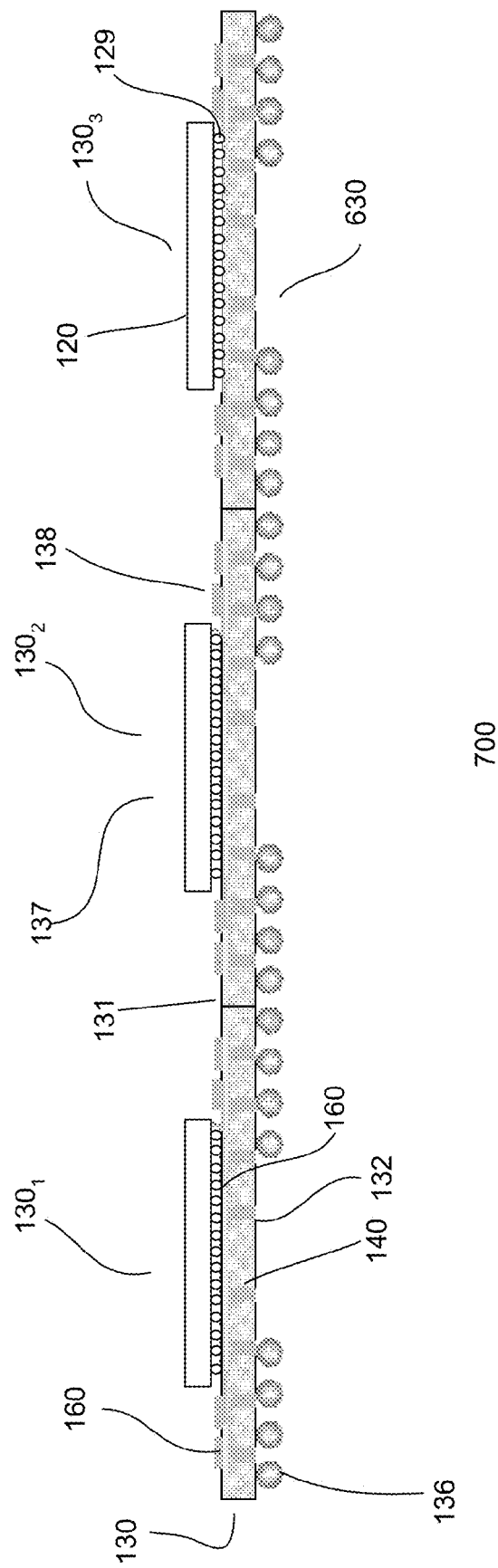

SEMICONDUCTOR PACKAGES AND METHODS OF PACKAGING SEMICONDUCTOR DEVICES

CROSS-REFERENCE TO RELATED APPLICATIONS

This is a continuation-in-part application which claims benefit of U.S. patent application Ser. No. 14/257,013, filed Apr. 21, 2014 which is a continuation application of U.S. patent application Ser. No. 13/360,796, filed Jan. 29, 2012, now U.S. Pat. No. 8,703,534, which claims priority to U.S. Provisional Application Ser. No. 61/437,685, filed Jan. 30, 2011. These applications are hereby incorporated by reference in their entireties.

BACKGROUND

Package-on-packages (PoP) are particularly useful, for example, in the PDA/mobile phone devices where small packaging size is an important factor. Existing Package-on-package (Pop) structures stack a top laminate-based package onto another laminated substrate or laminate-based substrate. The conventional PoP structure suffers from several disadvantages. For example, the mismatch of coefficient of thermal expansions (CTEs) between the laminated substrate and die causes problems like warpage of the packages which affects robustness of the package. In addition, the additional substrate incurs extra cost.

From the foregoing discussion, there is a desire to provide an improved package.

SUMMARY

A method of forming semiconductor assemblies is disclosed. The method includes providing an interposer with through interposer vias. The interposer includes a first surface and a second surface. The through interposer vias extend from the first surface to the second surface of the interposer. The first and second surfaces of the interposer include interposer contact pads thereon. The through interposer vias facilitate electrical coupling between the interposer contact pads on the first and second surfaces of the interposer. The second surface of the interposer includes interposer contacts disposed thereon. The interposer contacts are configured to facilitate electrical coupling between the interposer contact pads and an external device At least a first die is mounted on at least one die attach region on the first surface of the interposer. The first die comprises a first surface with first conductive contacts thereon. The interposer comprises material with coefficient of thermal expansion (CTE) similar to that of the first The first conductive contacts of the first die are coupled to the through interposer vias on the first surface of the interposer. A bonding process which does not require a reflow process is performed to form connections between the first die and interposer.

In another embodiment, a semiconductor assembly is disclosed. The assembly comprises an interposer with through interposer vias. The interposer comprises a first surface and a second surface. The through interposer vias extend from the first surface to the second surface of the interposer. The first and second surfaces of the interposer include interposer contact pads thereon. The through interposer vias facilitate electrical coupling between the interposer contact pads on the first and second surfaces of the interposer and the second surface of the interposer includes interposer contacts disposed thereon. The interposer contacts are configured to facilitate electrical coupling between the interposer contact pads and an external device. The assembly also includes at least first and second dies on first and second die attach regions on the first surface of the interposer, the dies comprise a first surface with conductive contacts thereon. The interposer comprises material with CTE similar to that of the dies. The conductive contacts of the dies are coupled to the through interposer vias on the first surface of the interposer.

These embodiments, along with other advantages and features herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 7a-7d show another embodiment of a method for forming a semiconductor package;

DETAILED DESCRIPTION

Embodiments relate to semiconductor packages. The packages are used to package one or more semiconductor dies. For the case of more than one die, the dies may be arranged in a planar or side-by-side arrangement, vertical arrangement, or a combination thereof. The dies, for example, may include memory devices, RF device, logic devices, communication devices, optoelectronic devices, digital signal processors (DSPs), microcontrollers, microprocessor, system-on-chips (SOCs) as well as other types of devices or a combination thereof. Such packages may be incorporated into electronic products or equipments, such as phones, computers as well as mobile and mobile smart products. Incorporating the packages into other types of products may also be useful.

Figure 1A:
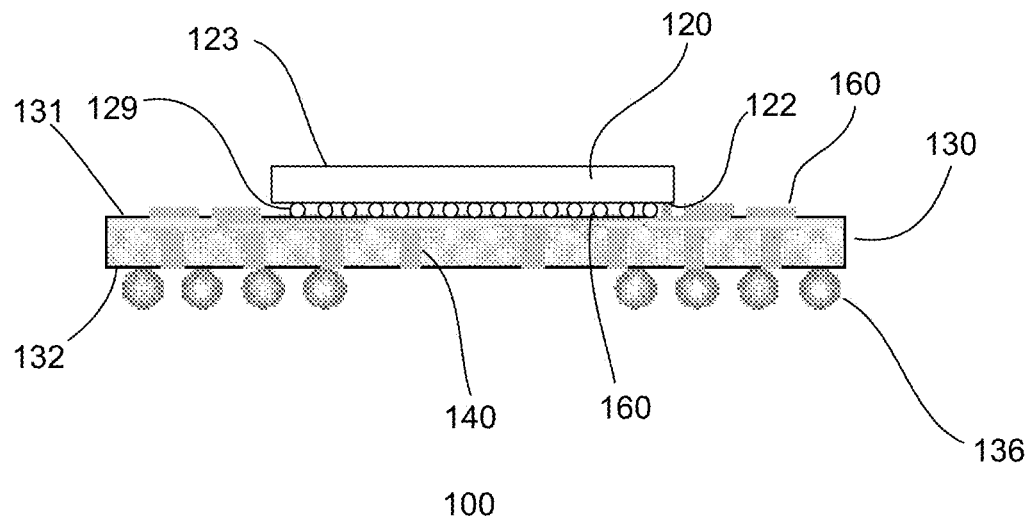
FIGS. 1a-1b show embodiments of semiconductor packages.
Figure 1B:
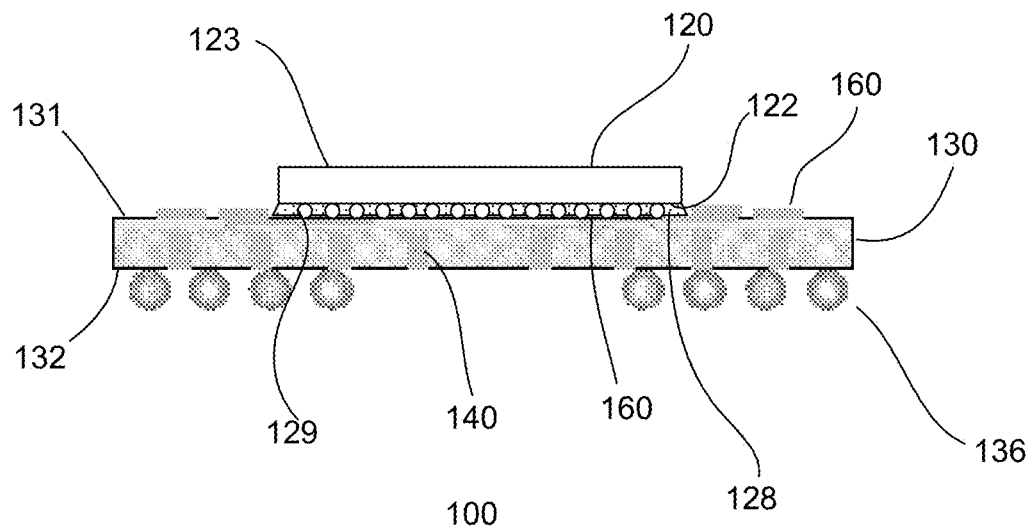

FIGS. 1a-1b show embodiments of a semiconductor assembly 100. The assembly, in one embodiment, includes an interposer 130. The interposer serves as a medium for coupling at least a die to a package substrate. The interposer includes first and second major surfaces 131 and 132. The first major surface, for example, may be referred to as the "top surface" and the second major surface, for example, may be referred to as the "bottom surface". Other designations for the surfaces may also be useful. In one embodiment, the top surface includes a die attach region on which a die is attached.

The top and bottom surfaces of the interposer are provided with redistribution layers (RDLs) having conductive traces and interposer contact pads 160, including solder lands for example. For simplicity, the redistribution layer of the bottom surface of the interposer is not shown. The interposer contact pads may be formed of a suitable material, including Ni, Cu, Au, Pd, Al or a combination thereof. The contact pads may be covered with surface finishes, such as Cu-OSP, Ni—Au, alloys or conductive polymers. Additional external interposer contacts 136 may be disposed onto the contact pads and may be in the form of, for example, spherical shaped structures, bails or elongated structures. The dimension of the external interposer contacts, for example, may be about less than 150 μm. Other suitable dimensions may also be useful. The external interposer contacts ay be formed from a conductive material. For example, the contacts may be formed from solders, such as lead-based or non lead-based solders. Alternatively, the external interposer contacts, for example, may include conductive pillars, such as but not limited to Cu pillars having solder cap thereon. Other suitable conductive pillars and non-solder based conductive materials may also be used. The external interposer contacts can be arranged in any suitable manner, including a regular ball grid array pattern. Arranging the contacts in other patterns such as a non-regular pattern or providing other types of contacts are also useful. The pitch of the external interposer contacts, for example, can be in the range of 150-180 μm. Other suitable pitch dimensions may also be useful.

The interposer 130 includes a plurality of via holes, such as through interposer vias 140 extending from the top surface to the bottom surface of the interposer. The through interposer vias may be filled with a conductive material. The conductive material, for example, may be copper or other materials of appropriate conductivity. In another embodiment, the through interposer vias may be partially filled with a conductive material and partially filled with a non-conductive or low conductivity material. The non-conductive or low-conductivity material may be, for example, poly silicon or polymer fill material. The through interposer vias provide electrical coupling between the top and bottom interposer contact pads. Alternatively, the interposer includes a plurality of via holes which may include a combination of through vias and blind vias. Other suitable configurations for the via holes may also be useful.

As described, the top and bottom surfaces of the interposer are provided with redistribution layers having conductive traces and interposer contact pads. The conductive traces may be provided on the top and bottom surfaces of the interposer to allow for re-routing of the top interposer contact pads and bottom interposer contact pads to achieve a desired pattern arrangement. The top and bottom interposer contact pads may be coupled through the conductive traces and the interposer interconnects. The conductive traces of a surface may be insulated from each other by a dielectric material (not shown). The pitch of the interposer contact pads on the top surface is finer relative to the pitch of the interposer contact pads at bottom surface. For example, the pitch of the interposer con act pads on the top surface is about 60-80 μm while the pitch of the interposer contact pads on the bottom surface is about 150-180 μm. Such configuration allows the interposer to function as a bridge between, for example, a flip chip die and a package substrate. Alternatively, the pitch of the interposer contact pads on the top surface, for example, may be the same as the pitch of the interposer contact pads at the bottom surface. Other suitable dimensions for the pitch of the interposer contact pads on the top and bottom surfaces may also be useful, depending on design requirement and technology trend.

A die 120 is mounted to a die attach region defined on the top surface of the interposer. The die, for example, is a singulated die of a wafer processed with a plurality of dies in parallel. The die has first and second major surfaces. One of the surfaces may be an active surface 122 with die contacts 129 while the other surface may be an inactive surface 123.

In one embodiment, the die is a flip chip. The active side of the die may be provided with die contacts or contact structures 129, such as contact bumps or pillars. The contact structures 129 may be in the form of, for example, spherical shaped structures, balls or elongated structures. Contact structures of other geometry may also be useful. The contact structures may be formed of solder or other types of conductive materials. Alternatively, contact structures, for example, may include conductive pillars, such as but not limited to Cu pillars having solder cap thereon. The contact structures may be arranged in various layout designs, for example, in a regular grid array arrangement. Other contact structure patterns may also be used. For example, the die contacts may be arranged in one or more rows disposed at about the center of the die or rows at the sides of the die or in a non-regular array.

In the case of a flip chip, the top interposer contact pads for connecting to the flip chip are disposed in the die attach region of the interposer. The pattern of the top interposer contact pads is configured to match the pattern of the flip chip contacts. For example, the flip chip contacts are mated to the interposer contact pads. The bottom interposer contact pads are coupled to the flip chip contacts, for example, by the through interposer vias and RDL traces on top and/or bottom surfaces.

As shown, the ma of the flip chip to the interposer leaves a space between the active surface of the flip chip and top interposer surface. In one embodiment, the space may be left unfilled, as shown in FIG. 1a. In other embodiments, an underfill 128 is provided in the space between the active surface of the die and top interposer surface, as shown in FIG. 1b. The underfill, for example, may be a capillary underfill or a non-conductive paste. The underfill, for example, may include an epoxy-based polymeric material. Other suitable types of underfill and underfill materials may also be useful.

The interposer, in one embodiment, is formed of a semiconductor material having a CTE which is the same or similar to the die. For example, the difference between the interposer and die CTE values is less than or equal to 3 ppm/° C. In one embodiment, the interposer may be formed of silicon material. The interposer may be a singulated interposer. For example, the interposer may be formed on a wafer having a plurality of interposers. The wafer is diced to singulate the interposers. The interposer may serve as a base for the semiconductor assembly 100. The interposer may be an inactive wafer or chip, or an active silicon wafer or chip. Other suitable types of material, such as but not limited to laminate substrate, may be used to form the base. Providing the base of the interposer having at least a similar CTE as the die reduces mechanical stress caused by a difference in CTE between the die and the package substrate.

Figure 2A:
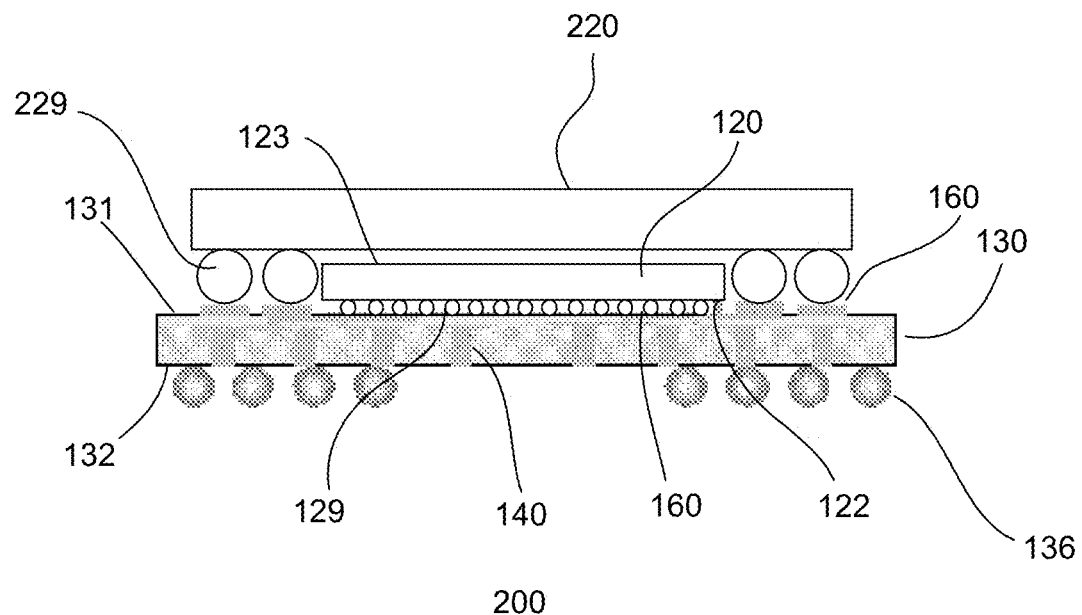
FIGS. 2a-2c show other embodiments of semiconductor packages.
Figure 2B:
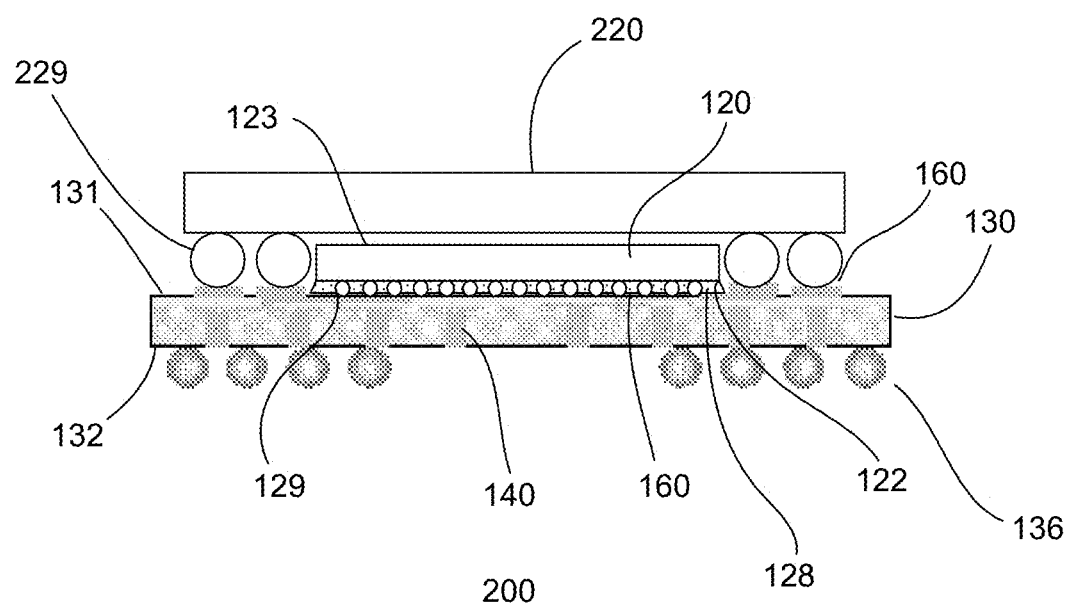
Figure 2C:
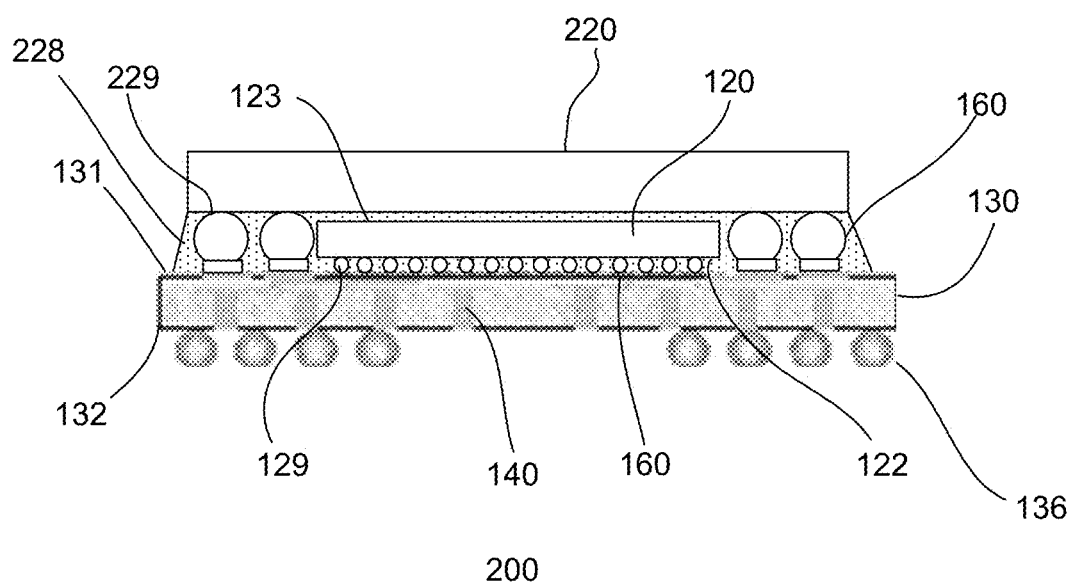

FIGS. 2a-2c show other embodiments of a semiconductor assembly 200. The assembly 200 comprises of a semiconductor assembly 100 and a second device/component 220. The semiconductor assembly 100 is similar to that described in FIGS. 1a-1b. As such, common features will not be further described in detail.

In one embodiment, a second device 220 is provided on the top surface of interposer 130. The second device 220, for example, may be a second die, such as flip chip. Alternatively, the second device may be a known-good package, forming a Package-on-Package (PoP). In the case where the second device is a second die, it is understood that the first and second dies need not be of the same type or material. The second device is disposed above the first die and attached to the top interposer surface. The second device, for example, includes device contacts 229 on its bottom surface. Depending on the type of device, the device contacts may be die contacts or package contacts. The device contacts 229, for example, may include the same type of material and form as the die contacts 129. Alternatively, the device contacts 229 may include different form and material as the die contacts 129. As shown, the lateral dimensions of the second device are larger than that of the first die. The device contacts, for example, are arranged in the periphery of the bottom surface of the second device to provide a space to accommodate the first die below. The device contacts are coupled to top interposer contacts in the second die attach region. The second die attach region, for example, is located at the periphery of the first die attach region.

As shown in FIG. 2a, no underfill is provided in the space between the first die and top interposer surface. In another embodiment, as shown in FIG. 2b, an underfill 128 is provided in the space between the active surface of the first die and top interposer surface, while no underfill is provided between the first die and second device as well as the second device and the top interposer surface. Alternatively, as shown in FIG. 2c, an underfill 228 is provided between the die, device and interposer top surface. The underfill 228, for example, may be a capillary underfill. The underfill, for example, may include an epoxy-based polymeric material. The underfill 128 and underfill 228, for example, may be of the same or different types. For example, the underfill 128 may be a non-conductive paste while the underfill 228 may be a capillary underfill. Other suitable types of underfill and underfill materials may also be useful.

Figure 3A:
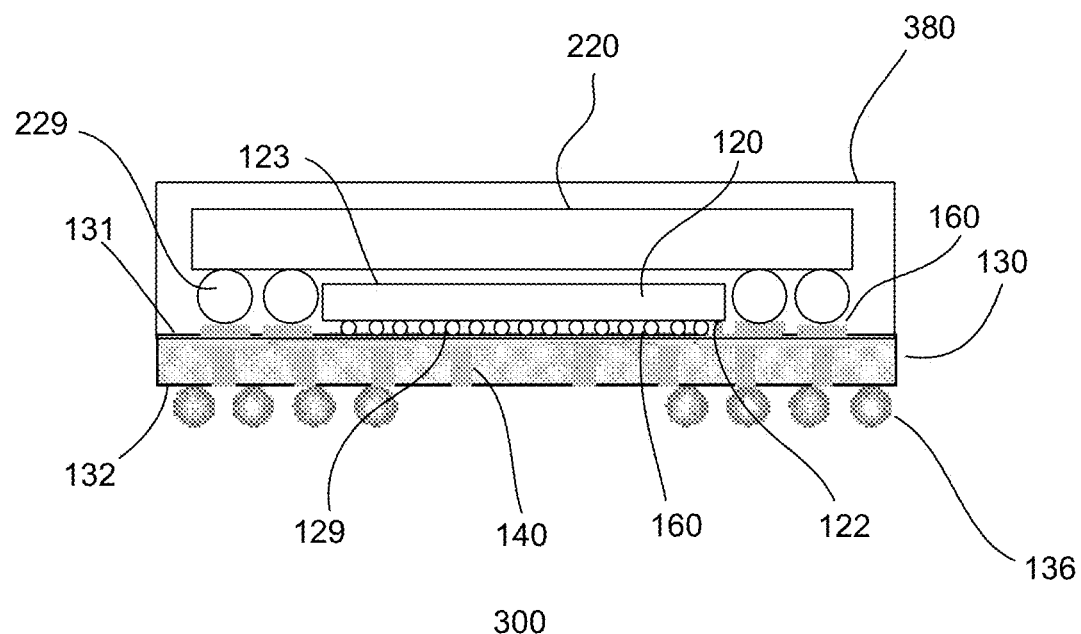
FIGS. 3a-3c show yet other embodiments of semiconductor packages.
Figure 3B:
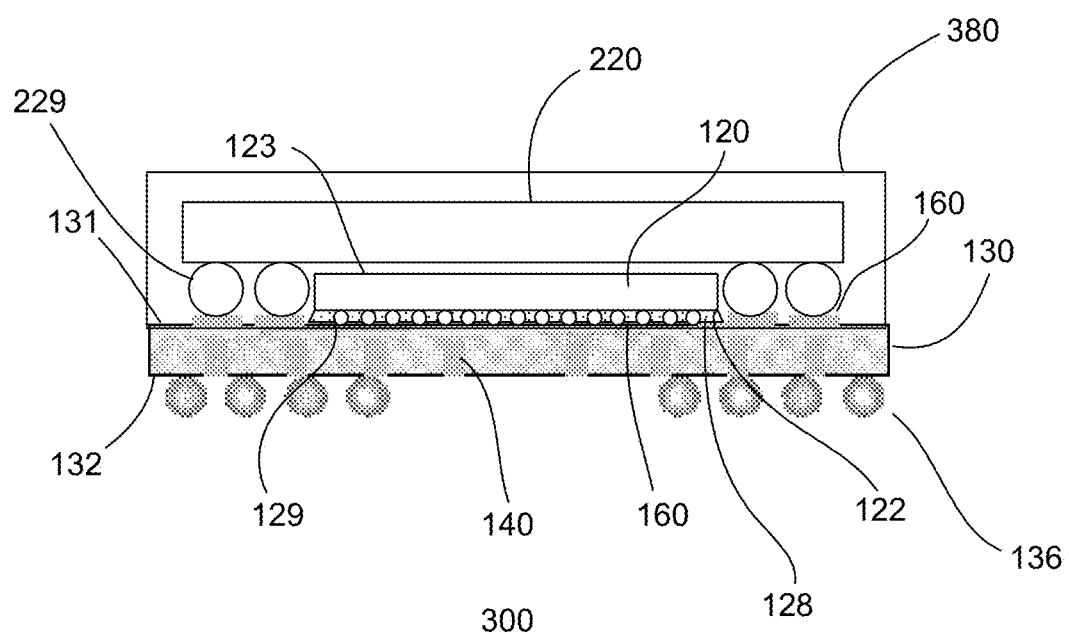
Figure 3C:
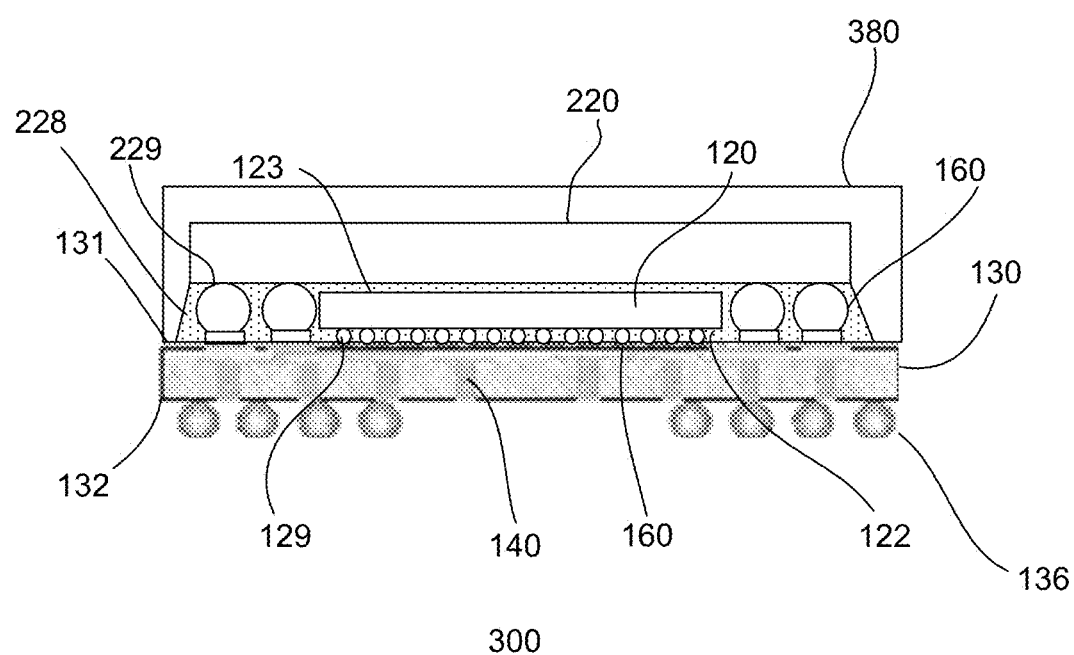

FIGS. 3a-3c show other embodiments of a semiconductor assembly 300. The assembly 300 is similar to the assembly 200 described in FIGS. 2a-2c. As such, common features may not be described or described in detail.

Referring to FIGS. 3a-3c, the assembly 300 includes an encapsulant 380 which encapsulates the die and device. For example, the encapsulant material may be an epoxy resin, silicone, or plastic. Other types of encapsulants may also be useful. For example, the encapsulant may be a molding compound. The encapsulant provides protection against the environment. As shown, the encapsulant covers the top of the second device. In other embodiments, the encapsulant may have a coplanar top surface with the surface of top device (not shown). In the case where the second device is a flip chip, for example, the inactive surface of the top die is exposed. The interposer ay, for example, serve as a base for the stacked interposer package.

Figure 4A:
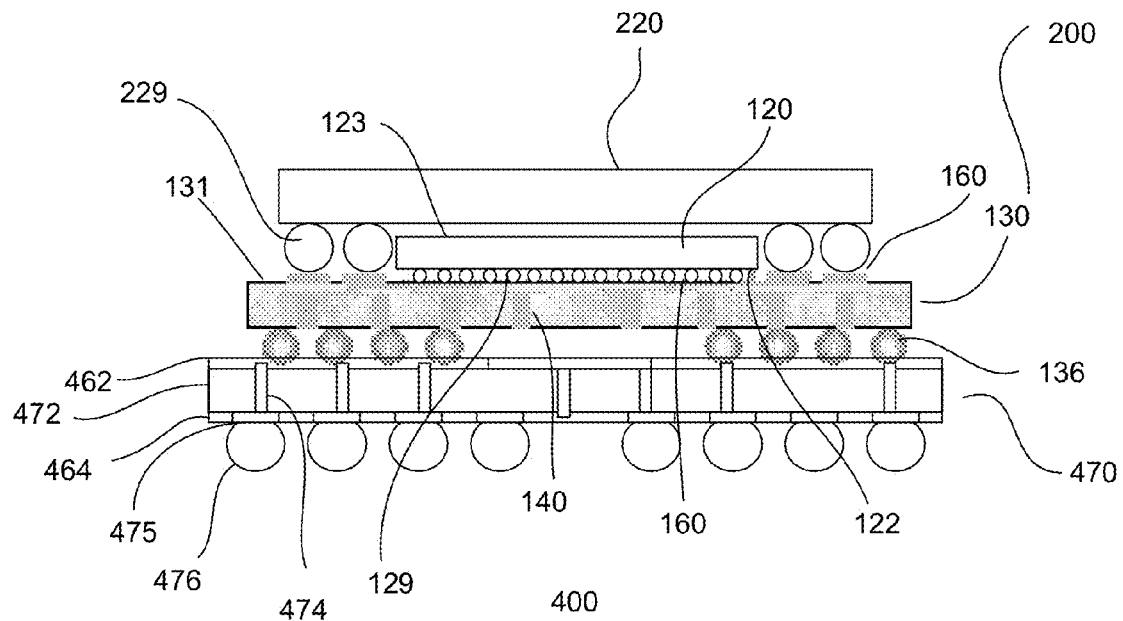
FIGS. 4a-4c show various other embodiments of semiconductor packages.
Figure 4B:
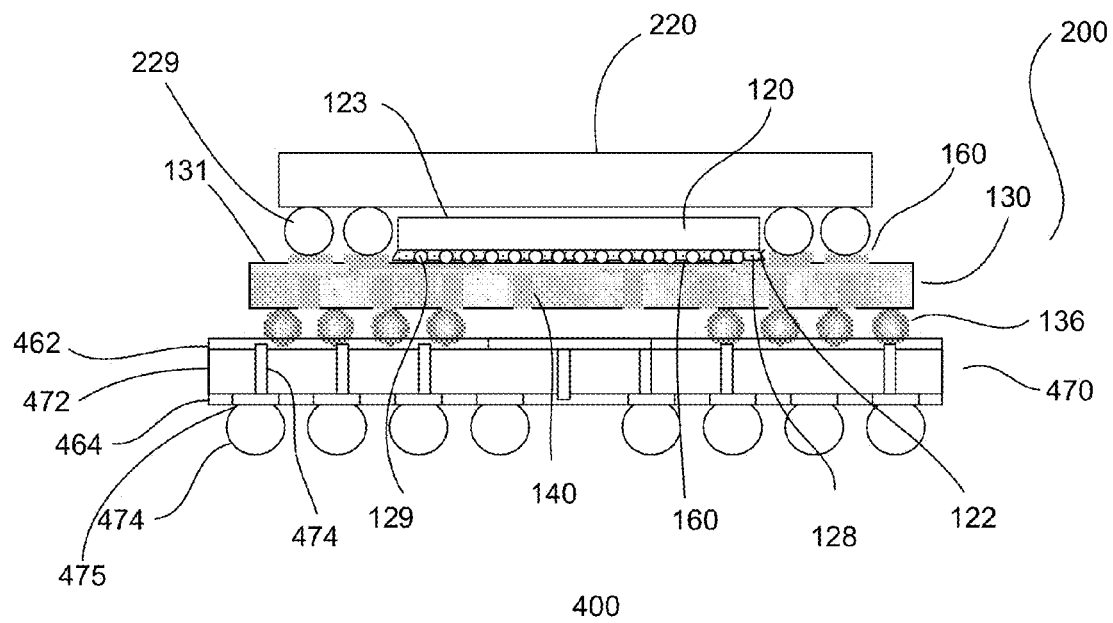
Figure 4C:
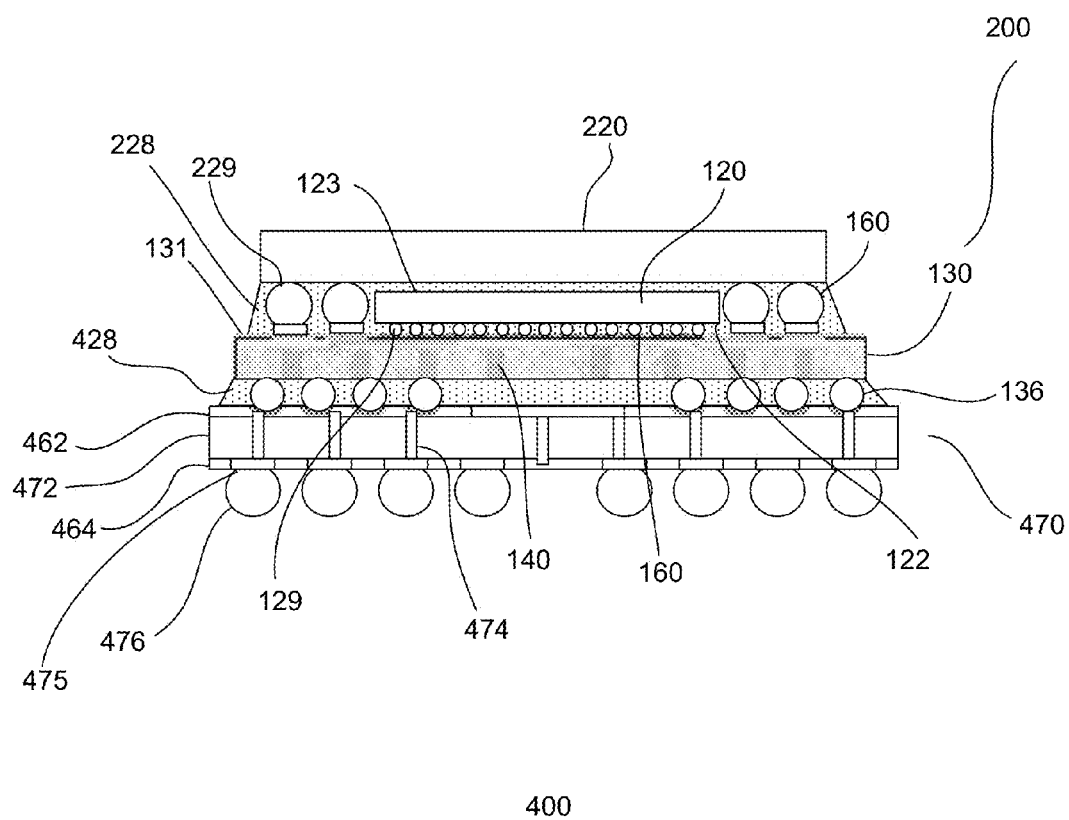

FIGS. 4a-4c show other embodiments of a package 400. As shown, the package 400 comprises of a semiconductor assembly and a package substrate. The semiconductor assembly is similar to that described in FIGS. 2a-2c. As such, common features will not be described in detail.

In one embodiment, package 400 comprises of a semiconductor assembly 200 mounted on top of package substrate 470. Referring to FIGS. 4a-4e, the semiconductor assembly 200 is provided on top of package substrate 470. The package substrate serves as a base of the package. The package substrate may be of any suitable geometry, for example, it may be in a rectangular shape to form a rectangular shaped package. The package substrate includes a substrate layer 472 with first and second major surfaces. The first surface, for example, is the top surface on which the interposer package is mounted while the second surface is the bottom surface. Other designation of surfaces may also be useful. The package substrate surface may further be provided with dielectric layers 462 and 464. The package substrate can be any type of substrates suitable for assembling of integrated circuit (IC) packages. In one embodiment, the package may be single-layered. In another embodiment, multi-layered substrates may be used. The different layers can be laminated or built-up. The package substrate can comprise various types of materials, including organic material, such as Bismaleimide Triazine (BT) or polyimide. Other types of materials can also be employed for the package substrate. For example, the package substrate is a multi-layer laminated substrate.

As shown, bottom substrate contact pads 475 are provided on the bottom surface of the package substrate. The bottom substrate contact pads serve as external package connections. For example, the bottom substrate contact pads can be electrically coupled to an external device (not shown), such as a circuit board through external substrate contacts 476. The external substrate contacts 476 may be formed from conductive material and comprise spherical shaped structures or balls. Preferably, the external substrate contacts comprise a reflowable conductive material. For example, the external substrate contacts may comprise of solder material, including lead-based, non lead-based alloys. Conductive polymers may also be used.

On the top surface of the package substrate are disposed top substrate contact pads. The top substrate contact pads comprise a top package substrate pad pattern. The top substrate contact pads, for example, are arranged in a manner that would correspond to the pattern of interposer contacts 136 of the interposer package. The top substrate contact pads, as shown, are disposed on a package substrate chip region on the top surface of the package substrate. The top substrate contact pads are coupled to the bottom substrate contact pads by, for example, package substrate vias 474. Electrical traces may be provided on or within the package substrate to couple the top substrate contact pads to the bottom substrate contact pads.

An underfill 428 may be provided between the interposer and package substrate, as shown in, for example, FIG. 4c. Alternatively, no underfill is provided between the interposer and package substrate, as shown in FIGS. 4a-4b. The underfill 428, for example, may be a capillary underfill or a non-conductive paste. The underfill, for example, may include an epoxy-based polymeric material. Other suitable types of underfill and underfill materials may also be useful. The underfill 428, for example, may be of the same as or different than the underfill 128 and underfill 228. The material characteristic such as viscosity of underfill 428, for example, may be different than the material characteristic of underfill 128 and underfill 228. For example, the underfill 428 may be a non-conductive paste while the underfill 228 may be a capillary underfill. Other configurations of the underfill between the interposer and the package substrate as well as underfill between the die, device and interposer may also be useful.

Figure 5A:
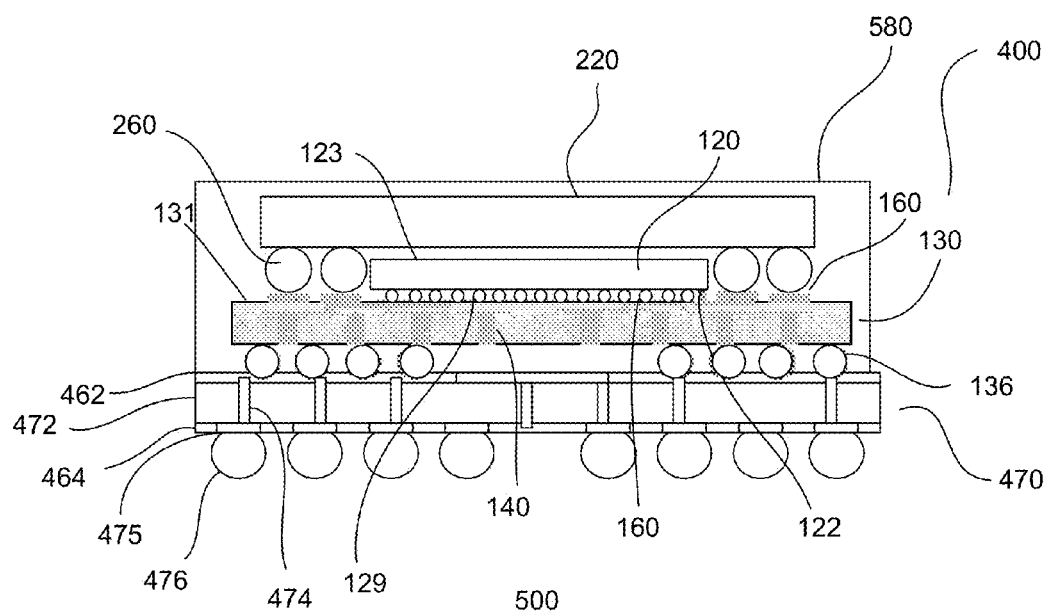
FIGS. 5a-5c show embodiments of other semiconductor packages.
Figure 5B:
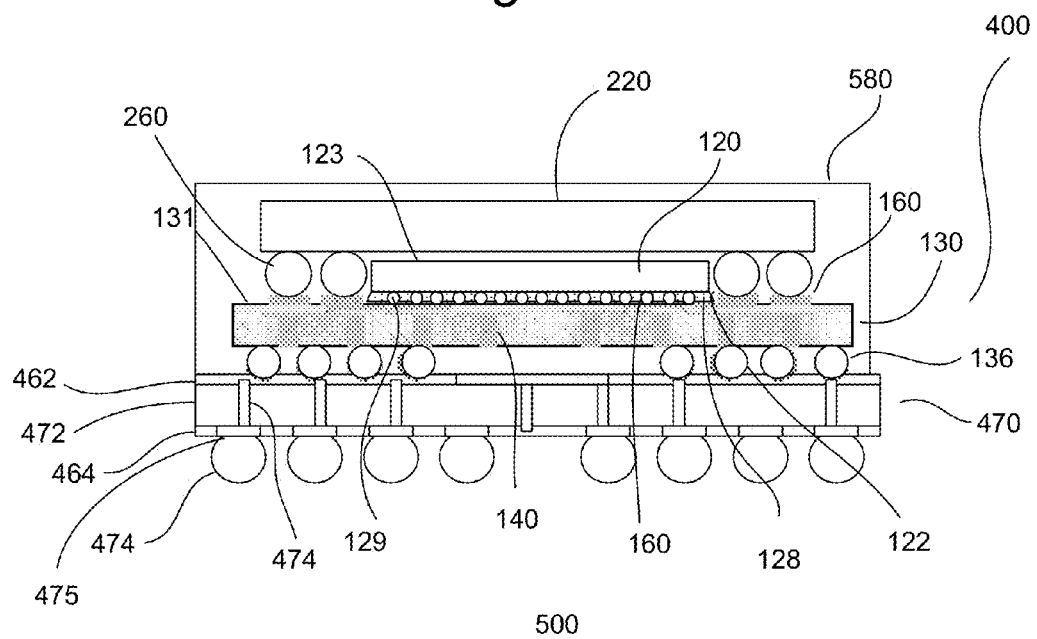
Figure 5C:
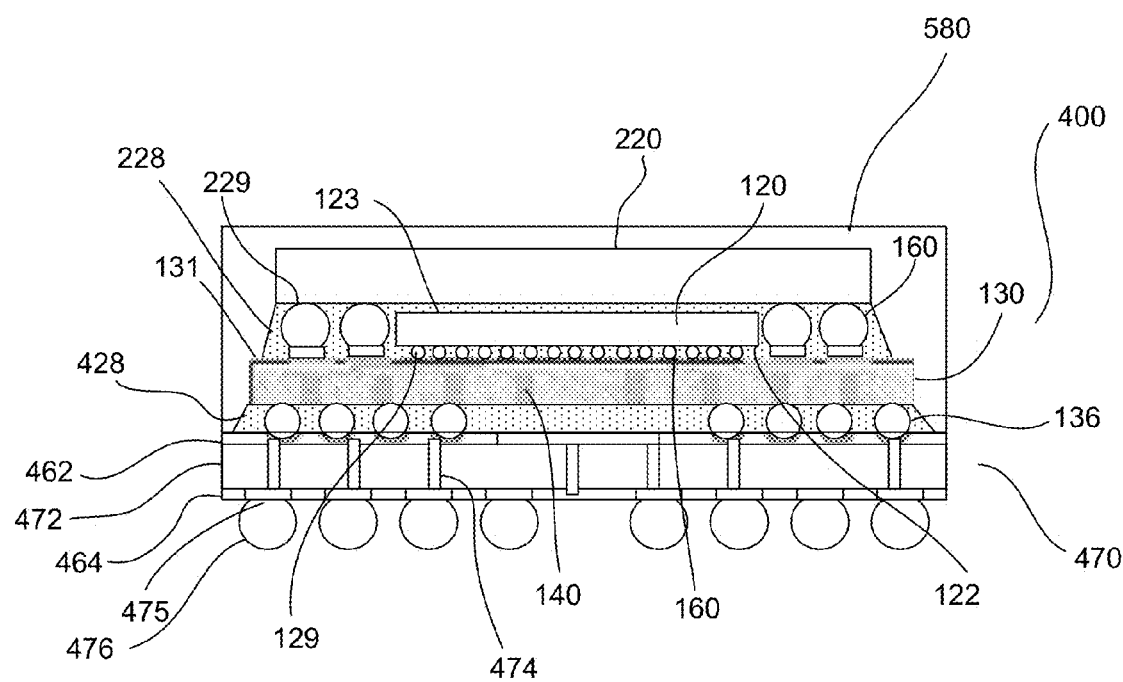

FIGS. 5a-5c show other embodiments of a package 500. The package, in one embodiment, is similar to package 400 described in FIGS. 4a-4c. As such, common features may not be described or described in detail.

Referring to FIGS. 5a-5c, the semiconductor assembly includes an encapsulant 580 which encapsulates package 400 comprising the die 120 and device 220 and interposer 130. For example, the encapsulant material may be an epoxy resin, silicone, or plastic. Other suitable types of encapsulants may also be useful. For example, the encapsulant may be a molding compound. The encapsulant provides protection against the environment. As shown, the encapsulant covers the top of the second device. In other embodiments, the encapsulant may have a coplanar top surface with the surface of top device (not shown). For example, the top surface of the top device is exposed.

FIGS. 6a-6d show an embodiment of a process 600 for forming a semiconductor assembly 100. The process involves features or elements described in FIGS. 1a-1c above. Features with the same reference numerals will not be described in detail. The process includes providing an interposer 130 having, for example, top and bottom surfaces 131 and 132. A first die attach region 137 is defined on the top surface on which a first die is mounted.

In one embodiment, the interposer is provided as part of an interposer substrate 630 prepared with a plurality of interposers $130_1$-$130_n$. For illustrative purposes, the substrate includes 3 interposers $130_1$-$130_3$ (e.g., n=3). However, it is understood that the interposer substrate may be prepared with other number of interposers. The number of interposers may depend on the size of the interposer substrate. The interposer substrate, for example, may be a semiconductor wafer, such as a silicon wafer. Other types of substrates may also be useful.

The top and bottom surfaces of the interposer are prepared with interposer contact pads 160, including solder lands for example. Additional external interposer contacts 136 are disposed onto the contact pads, which may be in the form of, but not limited to spherical shaped structures, balls or elongated structures. The external interposer contacts may be formed from a conductive material. For example, the contacts may be formed from solders, such as lead-based or non lead-based solders. Alternatively, the external interposer contacts, for example, may include conductive pillars, such as but not limited to Cu pillars having solder cap thereon. Other suitable conductive pillars and non-solder based conductive materials may also be used. The interposer substrate is further provided with through interposer vias 140 facilitating electrical coupling between the top and bottom interposer contact pads, and conductive traces allowing for re-routing of contact pads to a desirable pattern arrangement.

Figure 6A:
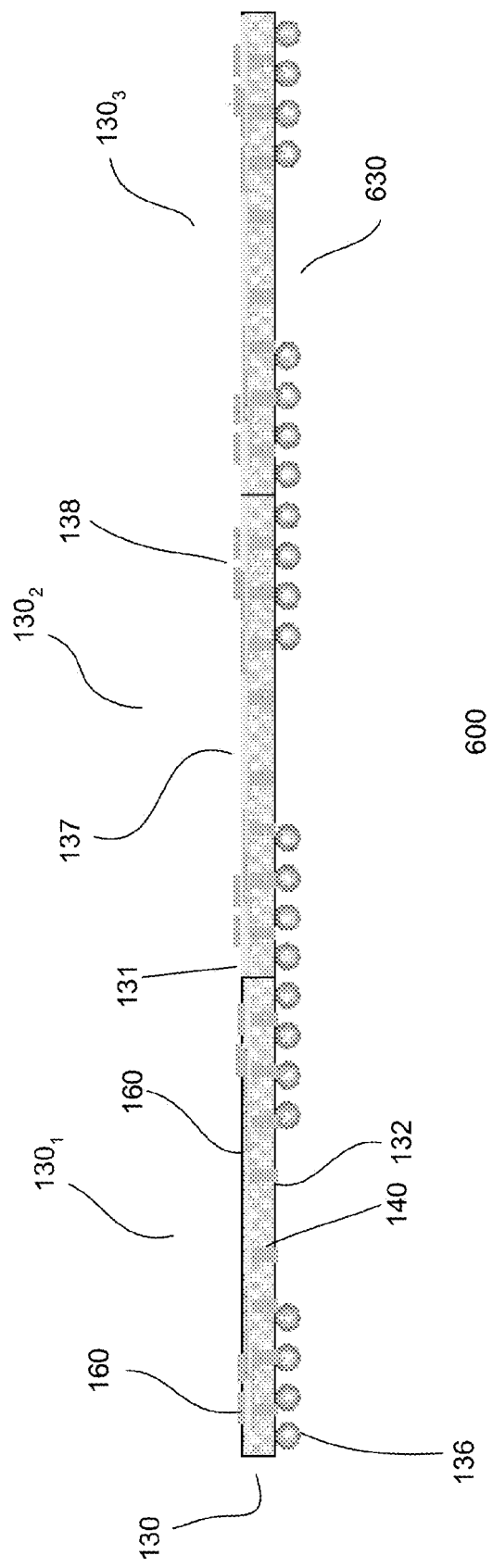
FIGS. 6a-6d show a process of forming a semiconductor package.
Figure 6B:
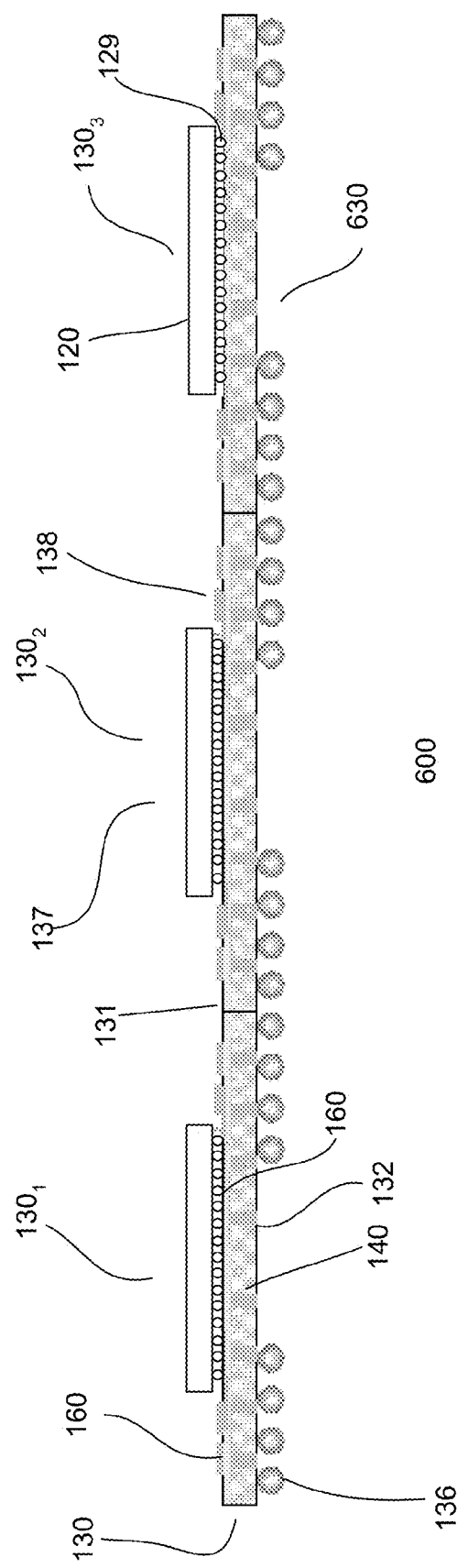

Referring to FIG. 6b, a first die is attached to the die attach region. The die, for example, is a flip chip provided with external die contacts 129 disposed on an active surface. In one embodiment, the die contacts, are mated to the top interposer contact pads in the die attach region, with the active surface of the die facing the top surface of the interposer. For example, the die is picked up using a pick-and-place machine, dipped into flux such that the external die contacts 129 are at least partially coated with flux and then attached onto the die attach region.

In one embodiment, after the dies are attached to the die attach regions of the interposers, a reflow process is performed, forming connections between the dies and interposers. Depending on the type of flux used, a clean process may be performed to remove the flux.

In another embodiment, after the dies are placed on the die attach regions of the interposers, a bonding process is performed in a bonding tool to form connections between the dies and the interposers. The bonding process, in one embodiment, includes a thermal compression bonding process. The thermal compression bonding process is performed by aligning and contacting the die contacts with the interposer contact pads of the interposers. The temperature of the bonding tool is elevated above the room temperature and the temperature is further increased above the melting point of the material of the die contacts, such as solder. The temperature is maintained above the melting point for a predetermined period, for example, about less than 10 seconds. Other suitable time period may also be useful. A bond force is applied on the dies while the temperature is above the melting temperature. The bond force should be sufficiently strong to ensure that a reliable intermetallic bond is formed between the die contacts and the interposer contact pads. Other suitable bonding process which does not require a reflow process may also be used to form connections between the dies and the interposers.

Figure 6C:
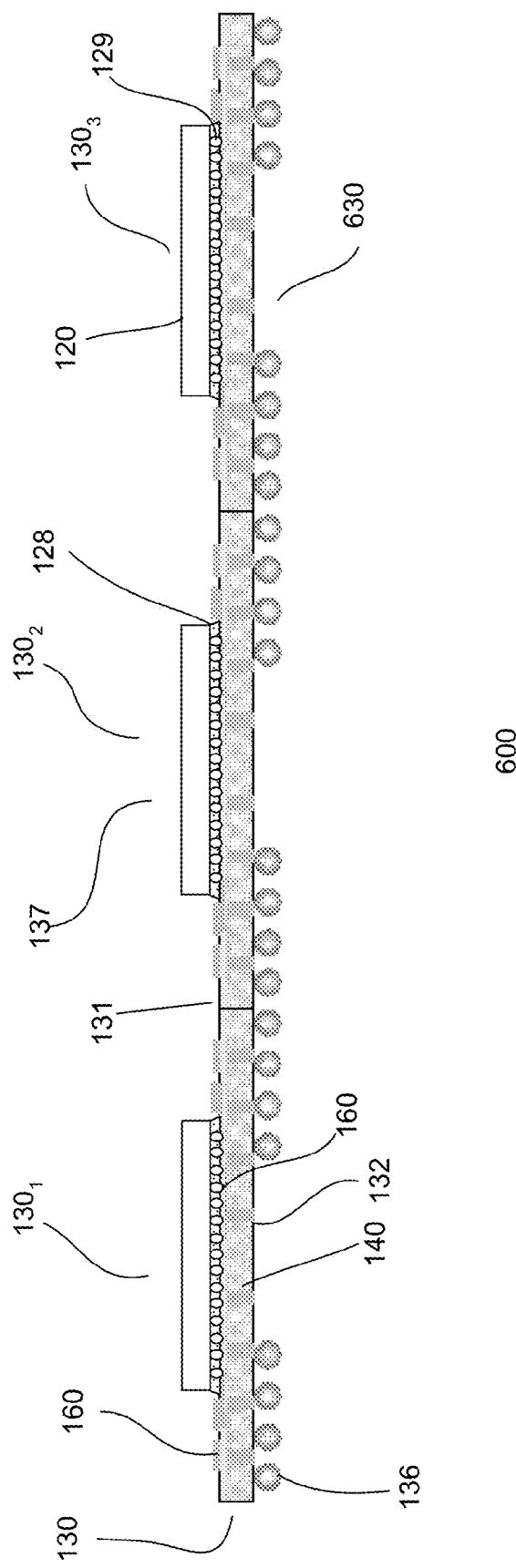

In FIG. 6c, an underfill 128 is dispensed into the space between the first die and the top interposer surface. Any suitable type of underfill may be used, including but not limited to capillary underfill, no-flow underfill, molded underfill for example. The capillary underfill, for example, fills the gaps between the die contacts and between the active surface of the dies and the top surface of the interposer through capillary action. The underfill, for example, may be an epoxy-based polymeric material. Other suitable underfill material may also be useful. The underfill may be partially or fully cured before the next process. In other embodiment, the step shown in FIG. 6c is skipped, resulting in an interposer package without underfill between the first die and interposer, as shown in FIG. 1a.

Figure 6D:
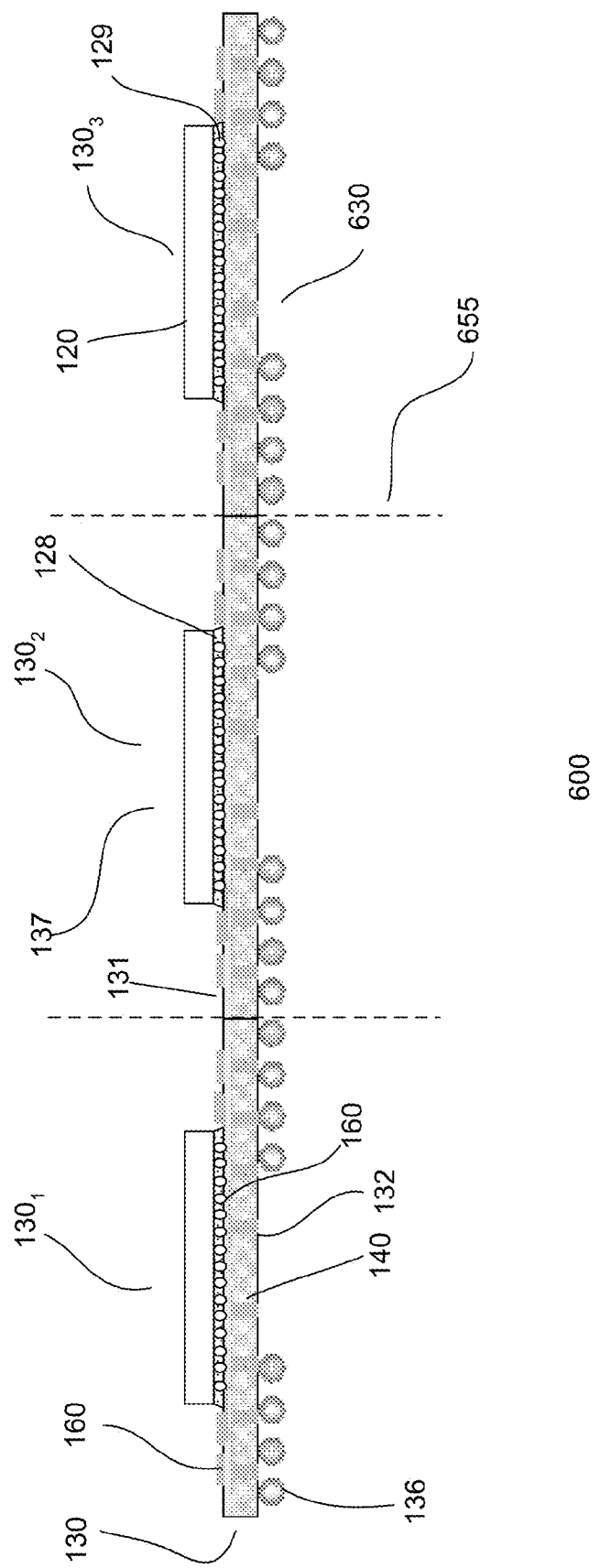

Referring to FIG. 6d, a singulation process (as indicated by dotted line 655) is performed on the interposer substrate with attached dies. The singulation process separates the interposers of the interposer substrate into individual semiconductor assemblies, such as semiconductor assembly 100 as shown in FIG. 1b. In one embodiment, the singulation process includes sawing. Other types of singulation processes may also be useful.

Figure 7B:
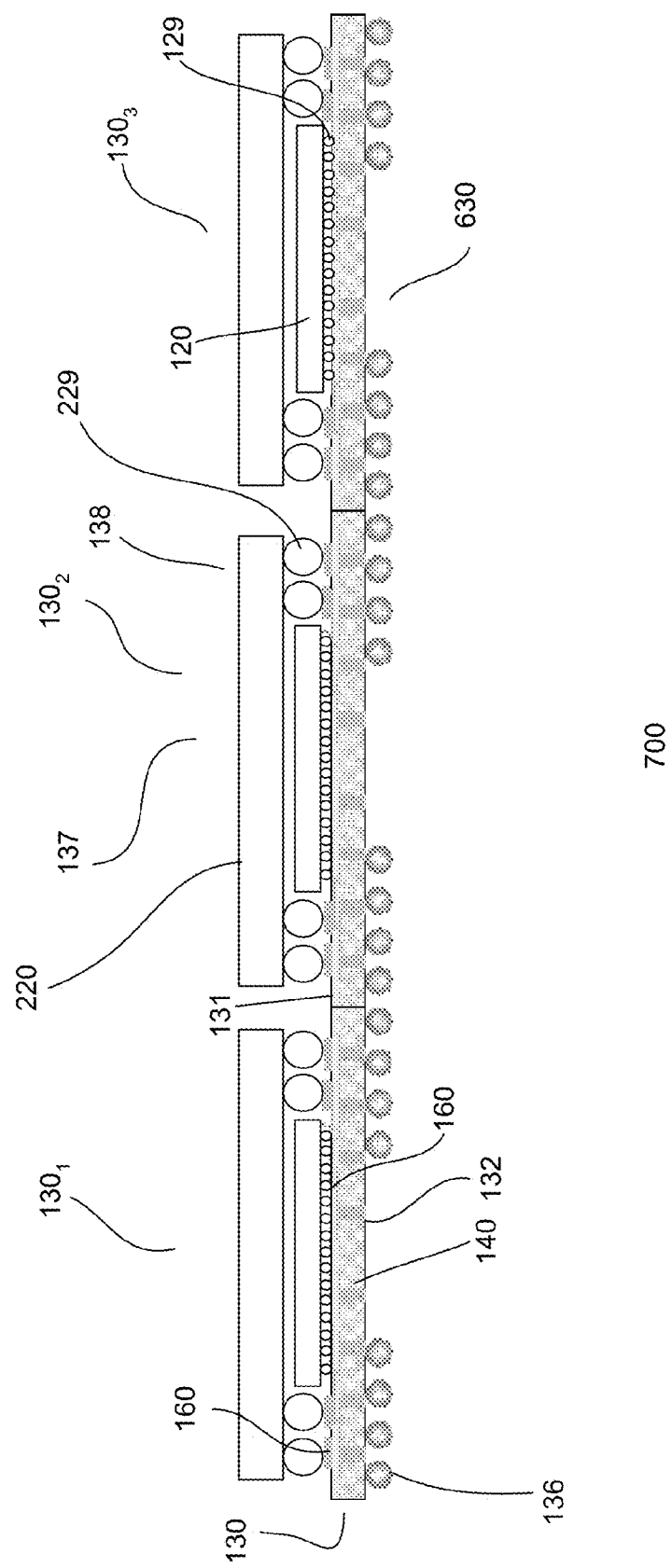

FIGS. 7a-7d show another embodiment of a process 700 for forming a semiconductor assembly 200. The process involves features or elements described in FIGS. 2a-2c above. Features with the same reference numerals will not be described in detail. Referring to FIG. 7a, an interposer substrate 630 is shown at the stage of processing, for example, as described in FIG. 6b. As such, common elements need not be further described in detail. As shown, the interposer substrate includes a plurality of interposers $130_1$-$130_n$. A first die 120 is mounted onto the first die attach region 137 of the interposers. The interposers also include a second die attach region 138 with interposer contact pads 160 on the top surface. The second die attach region, for example, is disposed on the periphery of the first die attach region.

Referring to FIG. 7b, a second device 220 is mounted on the top interposer surface. As described, the second device may be a second die, such as a flip chip, or a known-good package. The second device, for example, includes device contacts 229 on its bottom surface. Depending on the type of device, the device contacts may be die contacts or package contacts. As shown, the surface area of the second device is larger than that of the first die. The device contacts, for example, are arranged in the periphery of the bottom surface of the second device to provide a space to accommodate the first die below. The device contacts are coupled to top interposer contact pads in the second die attach region.

In one embodiment, after the die and device are atached to he die attach regions of the interposers, a reflow process is performed to establish the connections between the die and device to the interposer. Alternatively, a reflow process may be carried out after the attachment of the first die and another reflow process carried out after the attachment of the second device.

In another embodiment, after the die and device are placed on the die attach regions of the interposers, first and second bonding processes may be performed in a bonding tool to form connections between the die, device and the interposer. For example, the first bonding process may be carried out after the attachment of the first die and the second bonding process is performed after the attachment of the second device. The first and second bonding processes, in one embodiment, include thermal compression bonding process. The thermal compression bonding process is the same as that described in FIG. 6b. Other suitable bonding process which does not require a reflow process may also be used to form connections between the die, device and he interposer.

In yet another embodiment, the connections between the die and device to the interposer may be achieved by a combination of a bonding process, such as a thermal compression bonding process, and a reflow process. For example, a thermal compression bonding is carried out after the attachment of the first die to the interposer while a reflow process is carried out after the attachment of the second device to the interposer. Alternatively, a reflow process may be carried out after the attachment of the first die to form connections between the first die and the interposer while a thermal compression bonding process is performed after the attachment of the second device to the interposer to form connections between the second device and the interposer.

Figure 7C:
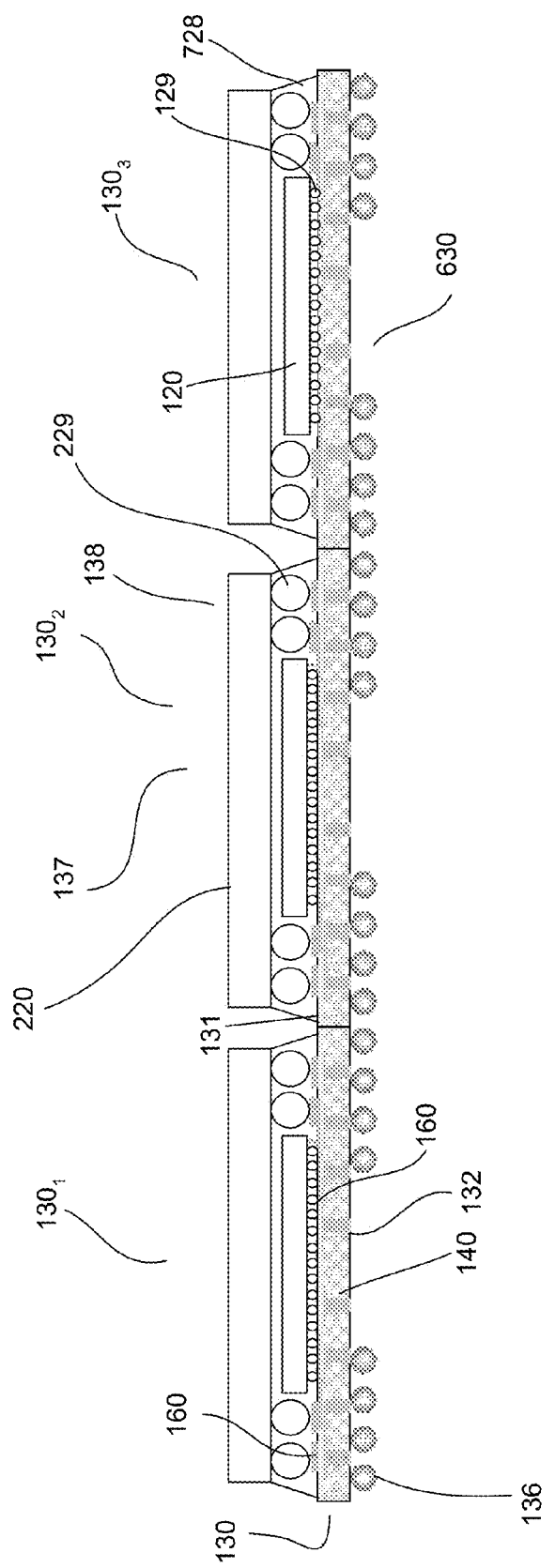

In FIG. 7c, an underfill 728 is dispensed into the space between the first die and second device and the top interposer surface. Alternatively, the first die 120 may be separately underfilled before attaching and underfilling second device 220. Any suitable type of underfill may be used, as aforementioned. The underfill, for example, may be an epoxy-based polymeric material. Other suitable underfill materials may also be useful.

Figure 7D:
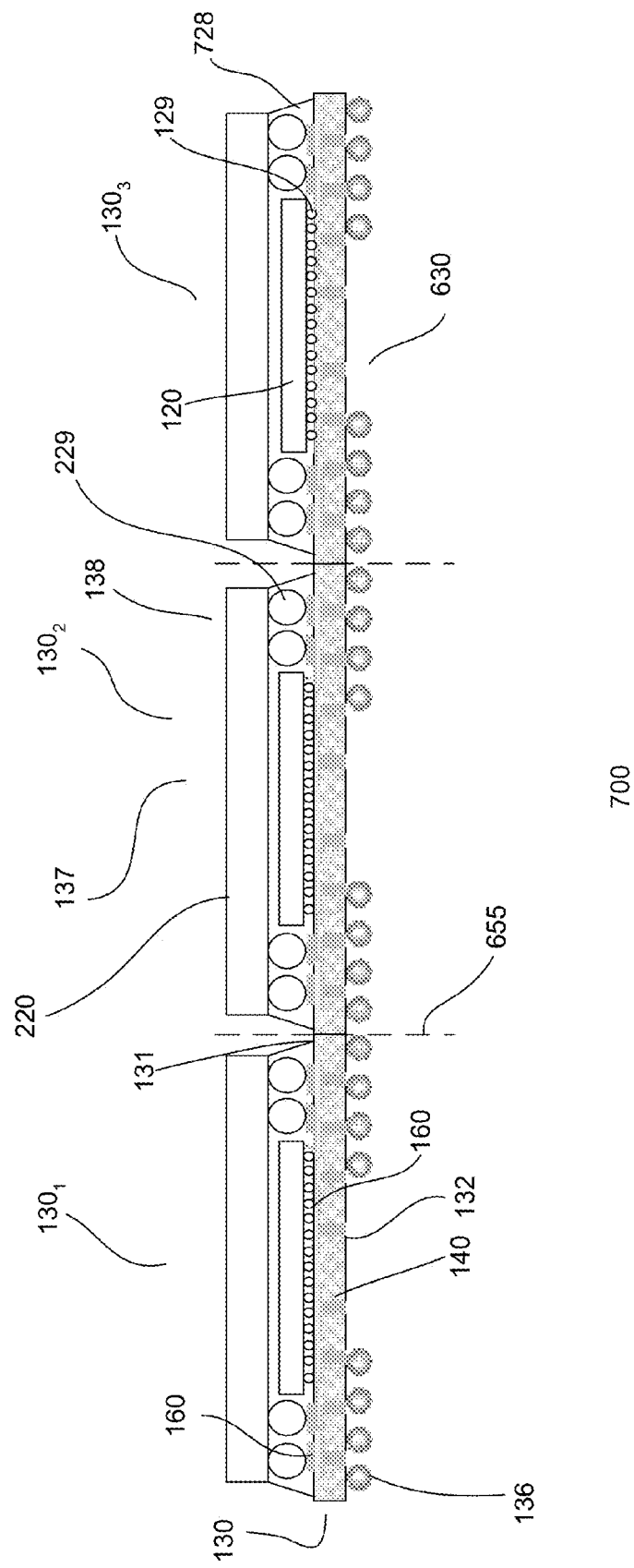

Referring to FIG. 7d, a singulation process (as indicated by dotted line 655) is performed on the interposer substrate with attached die and device. The singulation process separates the interposers of the interposer substrate i o individual semiconductor assemblies, such as semiconductor assembly 200 shown in FIG. 2a. In one embodiment, the singulation process includes sawing. Other types of singulation processes may also be useful.

In other embodiments, prior to singulation, an encapsulant is formed on the interposer encapsulating the die and device. In one embodiment, the encapsulant covers the second devices. In other embodiment, the encapsulant may be coplanar with the top surface of the second devices.

FIGS. 8a-8g show another embodiment of a process 800 for forming a package. The process involves features or elements described in FIGS. 4a-4c above. Features with the same reference numerals will not be described in detail. The process includes providing a package substrate 470. The package substrate serves as a base of a package for a semiconductor assembly. The package substrate is similar to that described in FIGS. 4a-4c.

In one embodiment, the package base is provided as part of a package substrate 470 prepared with a plurality of package substrate $470_1$-$470_n$. For illustrative purposes, the package substrate includes 3 package substrates $470_1$-$470_3$ (e.g., n=3). However, it is understood that the package substrate may be prepared with other number of package substrates. The number of package substrates may depend on the size of the substrate. The package substrates, for example, may be arranged in a strip format or an array format. Arranging the package substrates in other formats may also be useful.

As shown, the bottom surface of the package substrates is prepared with bottom substrate contact pads 475. The bottom substrate contact pads, for example, are conductive pads on which bottom substrate contacts are formed. On the top surface of the package substrate are disposed top substrate contact pads, arranged in a suitable pad pattern for connection to a semiconductor assembly.

Figure 8A:
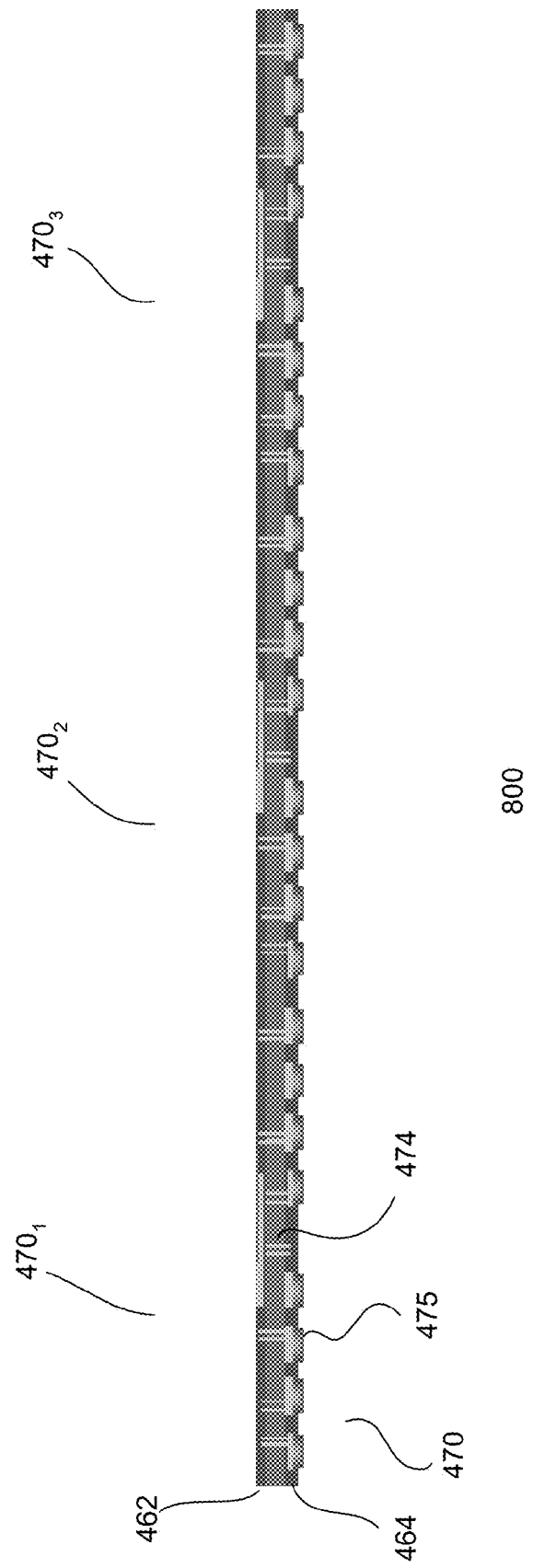
FIGS. 8a-8g show yet another embodiment of a method for forming a semiconductor package.
Figure 8B:
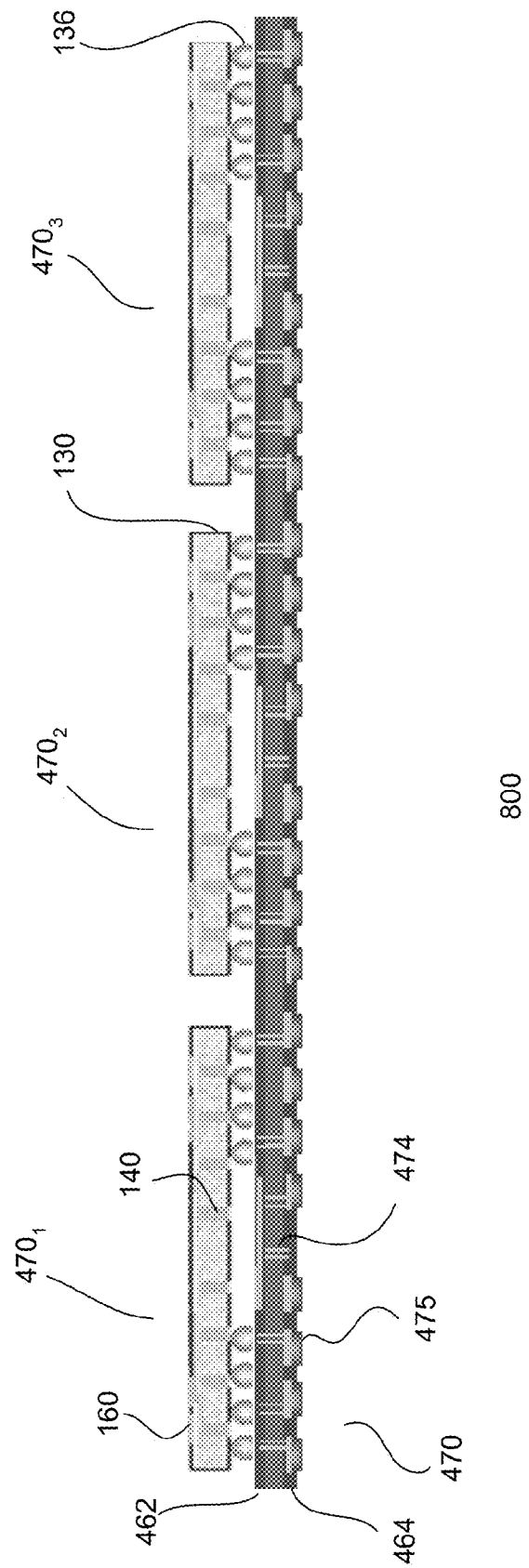

Referring to FIG. 8b, package interposers 130 are provided. The interposers are attached to the top surface of the package substrate. For example, interposers are attached to the top substrate contact pad regions of the package substrate. The interposer contacts 136 contact the top package substrate contact pads. For example, the interposer is picked up using a pick-and-place machine, dipped into flux such that the interposer contacts 136 are at least partially coated with flux and then attached onto the top substrate contact pad region.

Figure 8C:
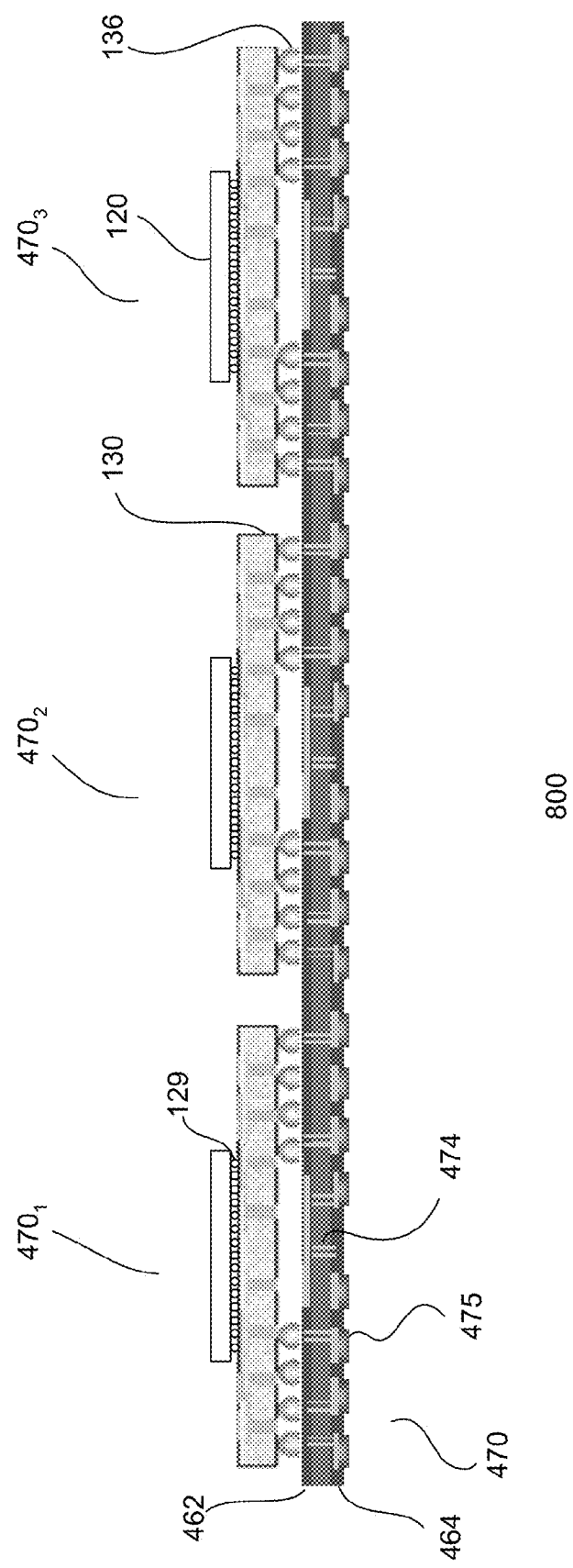

As shown in FIG. 8c, first dies are attached to first die attach regions of the interposers by a suitable die attach process. In one embodiment, a reflow process may then be performed, establishing the connections between the dies and interposers. Depending on the die attach process, a flux clean process may also be performed to remove the flux.

In another embodiment, first and second bonding processes may be performed in a bonding tool to form connections between the dies and the interposers and between the interposers and the package substrate. For example, the first bonding process may be carried out after the attachment of the interposer to the package substrate and the second bonding process is performed after the attachment of the first die to the interposer. The first and second bonding processes, in one embodiment, include thermal compression bonding process. The thermal compression bonding process is the same as that described in FIG. 6b. Other suitable bonding process which does not require a reflow process may also be used to form connections between the die and the interposer and between the interposer and the package substrate.

In yet another embodiment, the connections between the die to the interposer and between the interposer to the package substrate may be achieved by a combination of a bonding process, such as a thermal compression bonding process, and a reflow process. For example, a thermal compression bonding is carried out after the attachment of the dies to the interposers while a reflow process is carried out after the attachment of the interposers to the package substrate. Alternatively, a reflow process may be carried out after the attachment of the dies to form connections between the dies and the interposers while a thermal compression bonding process is performed after the attachment of the interposers to the package substrate to form connections between the interposers and the package substrate.

Figure 8D:
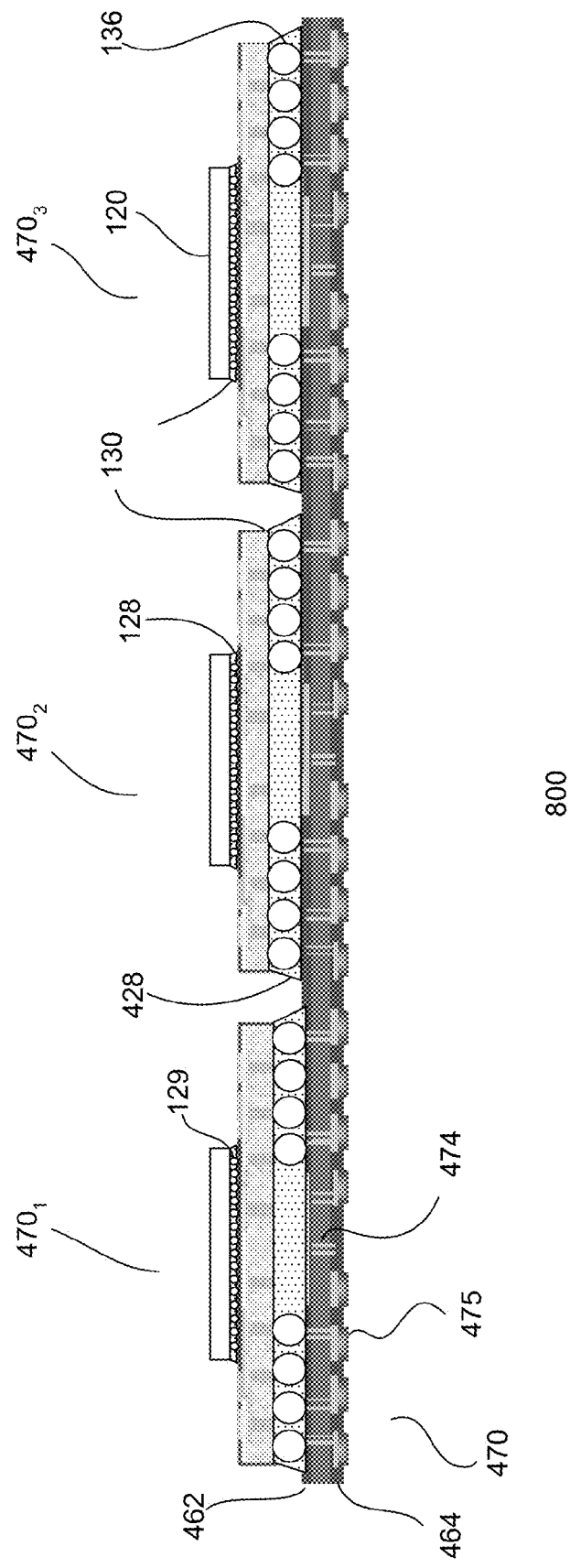

As shown in FIG. 8d, an underfill 128 is dispensed into the space between the first die and the top interposer surface. An underfill 428 is also dispensed into the space between the interposer and package substrate. It is also possible that this step may be skipped, resulting in a package having no underfill between the first dies and interposers and no underfill between the interposers and the package substrate. Alternatively, underfill may be provided in either the space between the interposers and the base substrate or between the dies and the interposers.

Figure 8E:
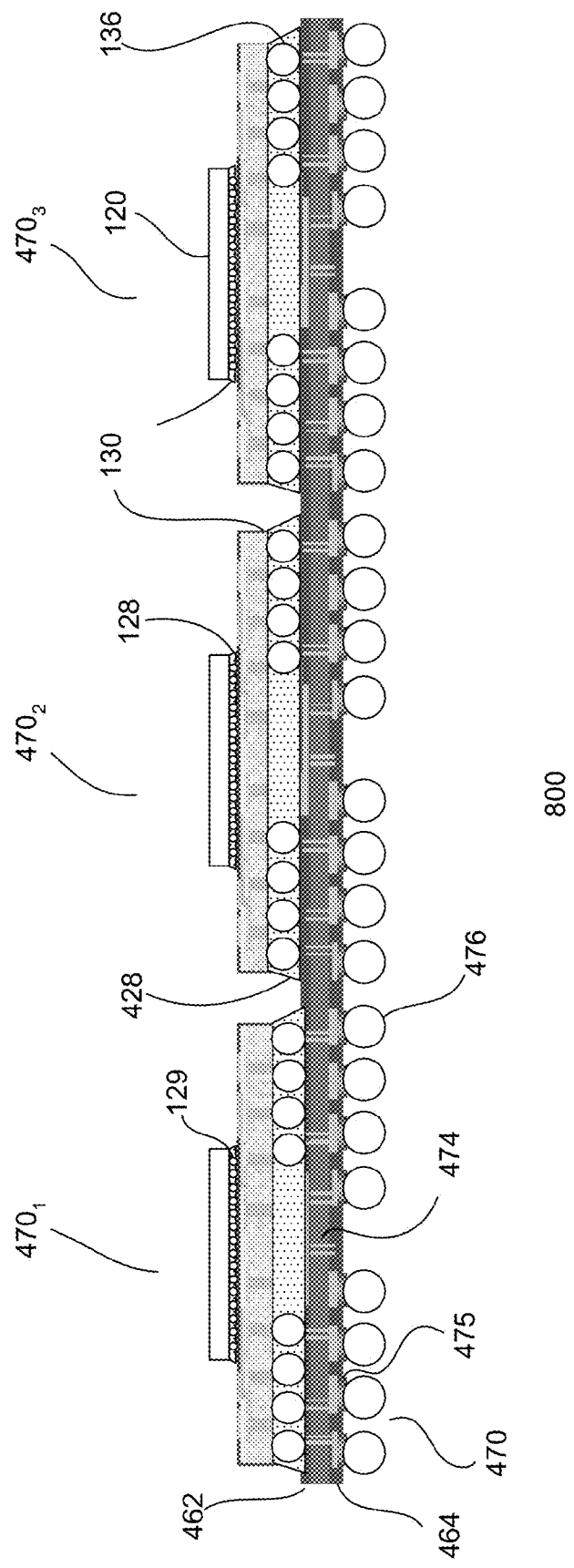
Figure 8F:
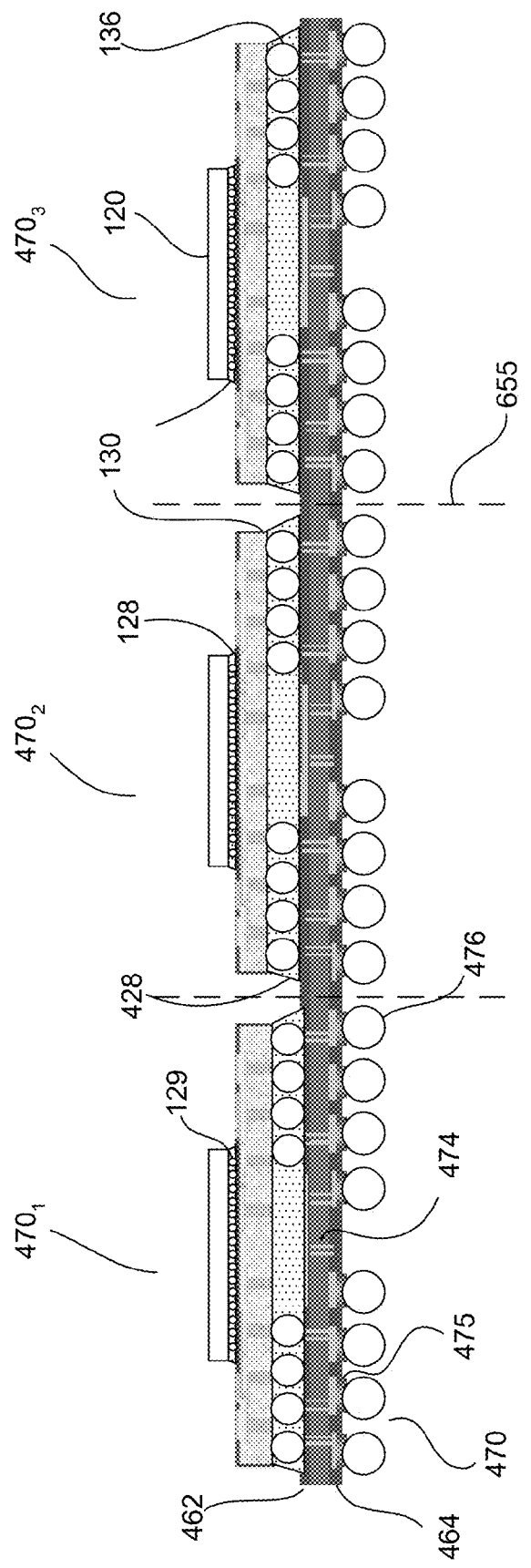

In FIG. 8e, external substrate contacts 476 are provided on the bottom surface of the package substrate. Referring to FIG. 8f, a singulation process is performed on he package substrate. The singulation process separates the package substrates having semiconductor assemblies into individual packages.

In other embodiments, prior to forming external substrate contacts on the package substrate, encapsulant is formed on the package substrate, encapsulating the first dies and interposers. In one embodiment, the encapsulant covers the dies. In other embodiment, the encapsulant may be coplanar with the top surface of the dies. The encapsulant may fill the spaces between the dies and top surface of the interposer where no underfill is provided.

Figure 8G:
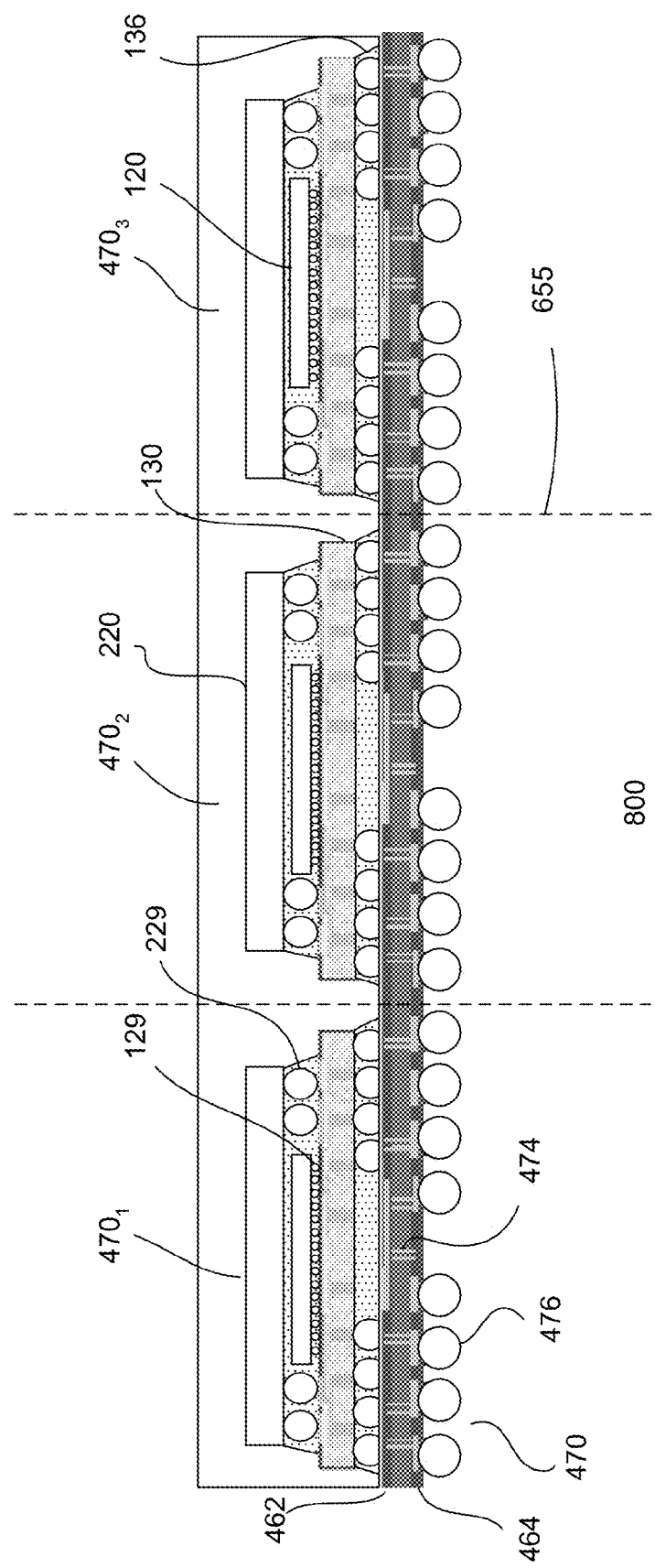

In yet another embodiment, as shown in FIG. 8g, external substrate contacts are formed on the package substrate with the encapsulated dies and interposers, followed by a singulation process to form individual encapsulated packages.

Figure 9A:
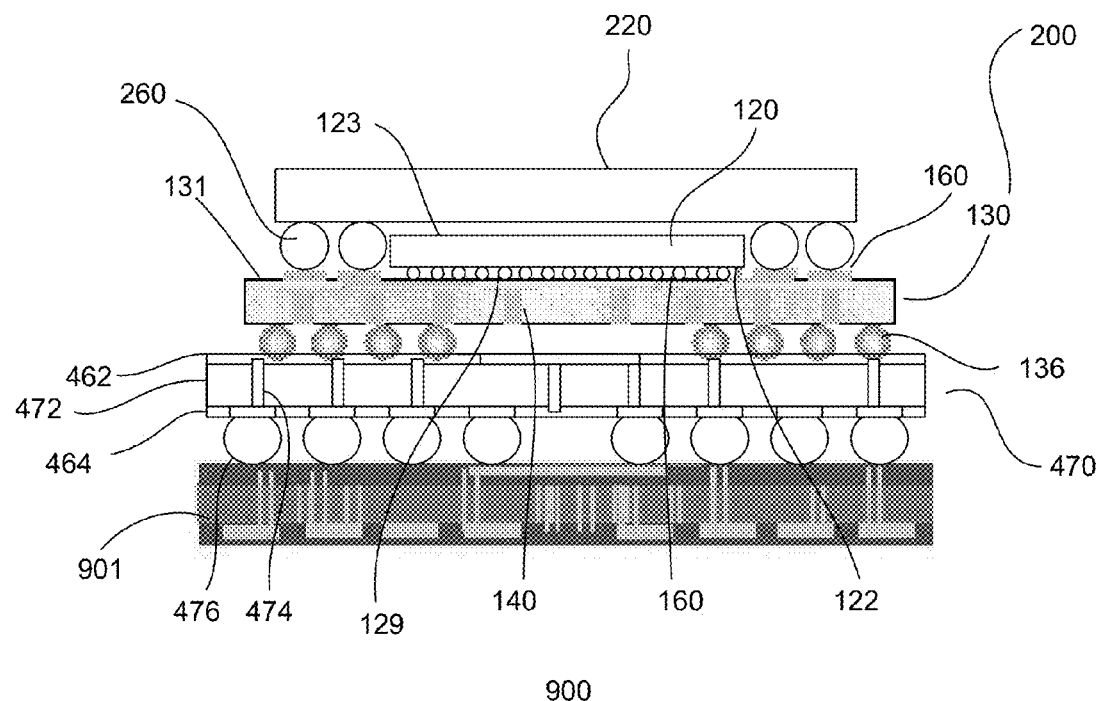
FIGS. 9a-9c show yet other embodiments of semiconductor packages.
Figure 9B:
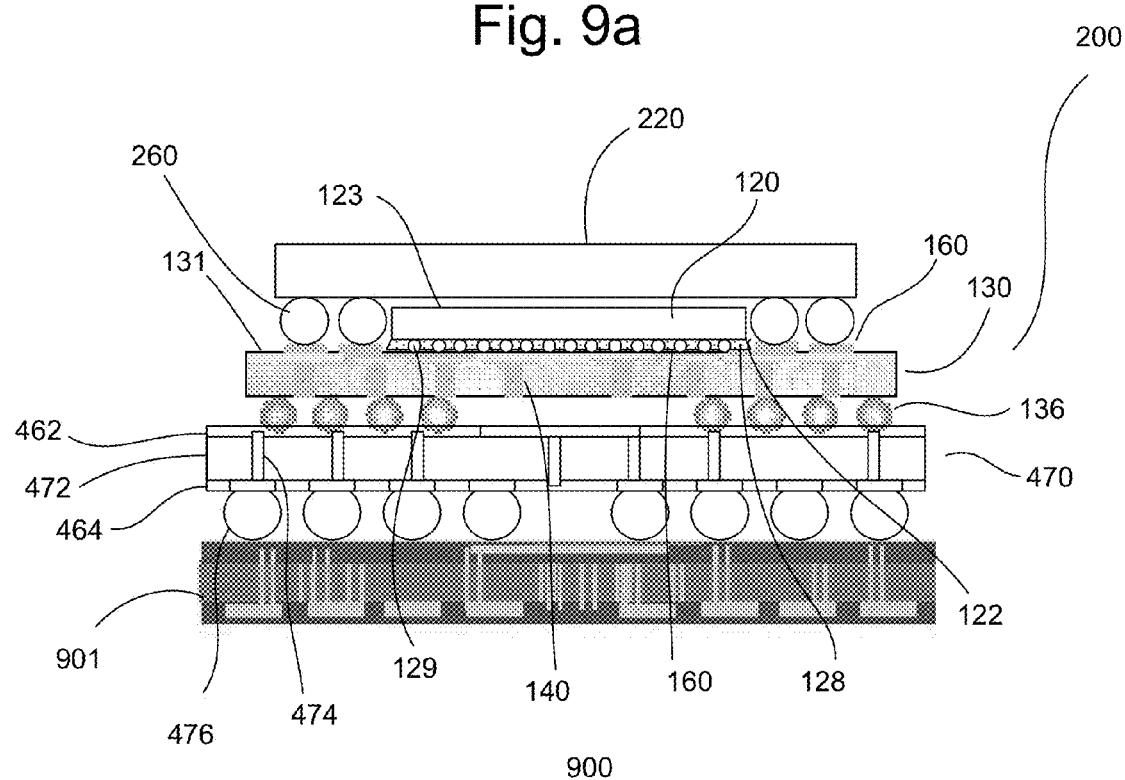
Figure 9C:
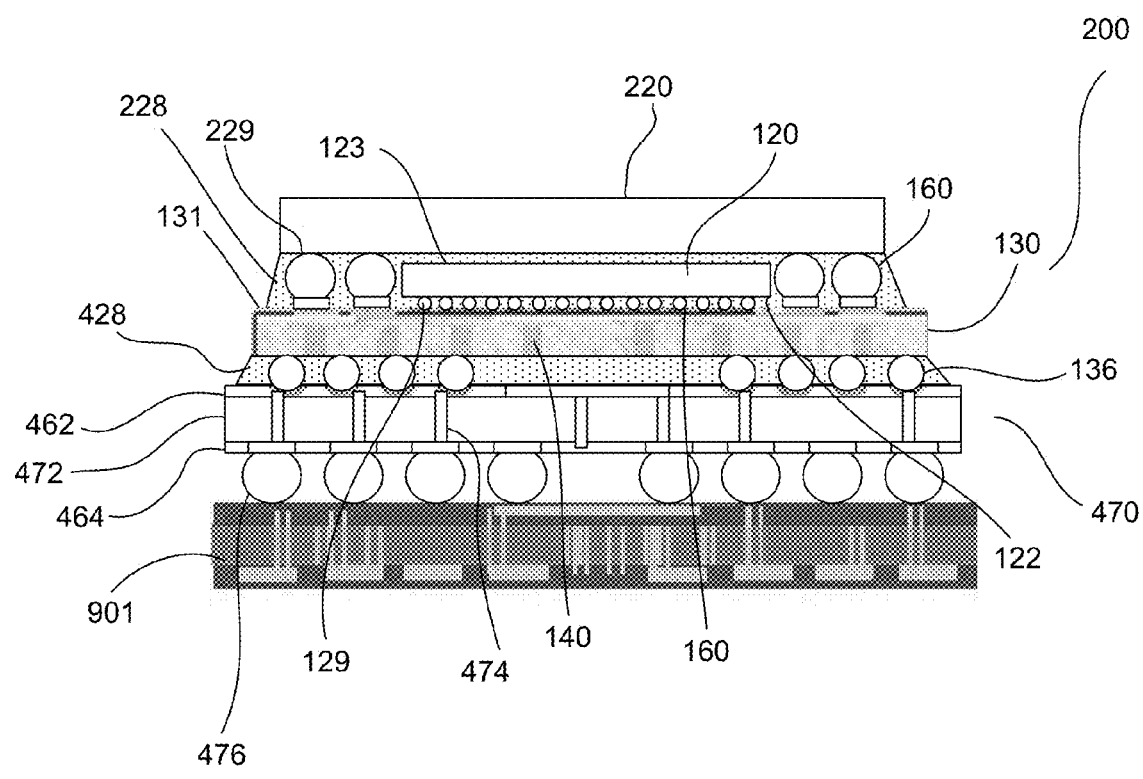

FIGS. 9a-9c show other embodiments of a semiconductor assembly 900. The semiconductor assembly, in one embodiment, is a package coupled to an external component. For example, the package is similar to package 400 or 500 and the external component may be a circuit board 901. The package is attached and coupled to the external component using, for example, reflow process. Alternatively, the package may also be attached and coupled to the external component using, for example, a non-reflow process, such as a thermal compression bonding process.

Referring to FIG. 9a, the package is provided without underfill between the die, device and top interposer surface. Alternatively, the package may be provided with an underfill between the first die and top interposer surface, as shown in FIG. 9b or between the die, device and top interposer surface, as shown in FIG. 9c.

Figure 10A:
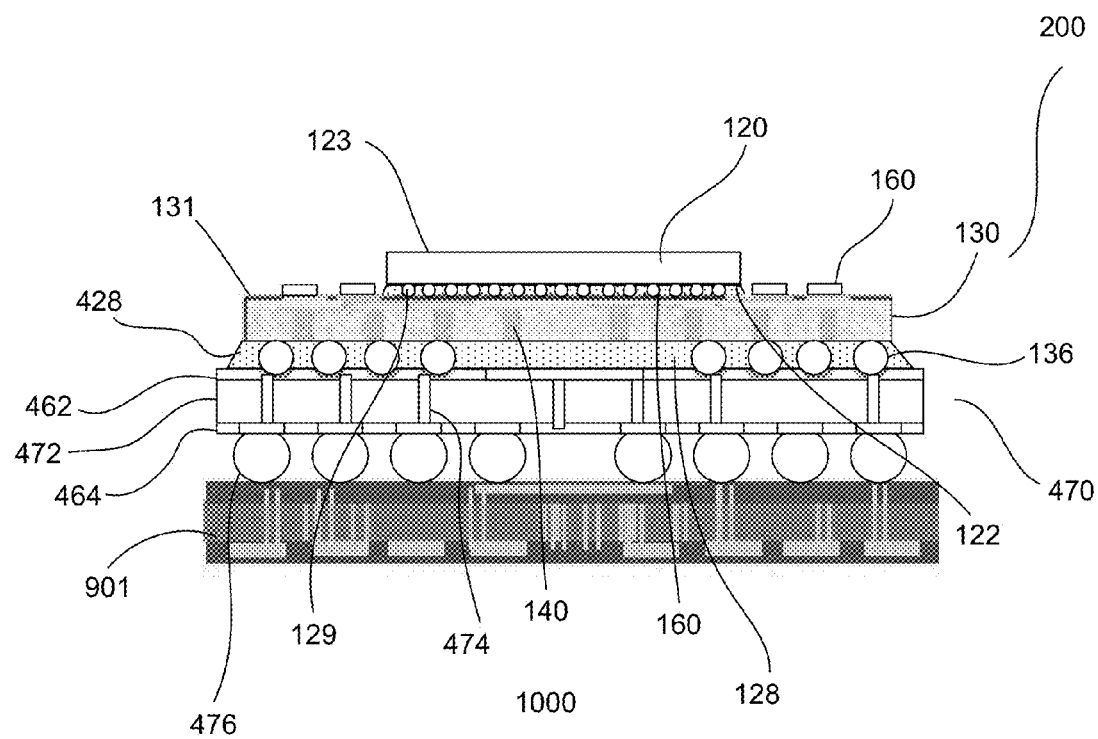
FIGS. 10a-10b illustrate yet another embodiment of a method for forming a semiconductor package.
Figure 10B:
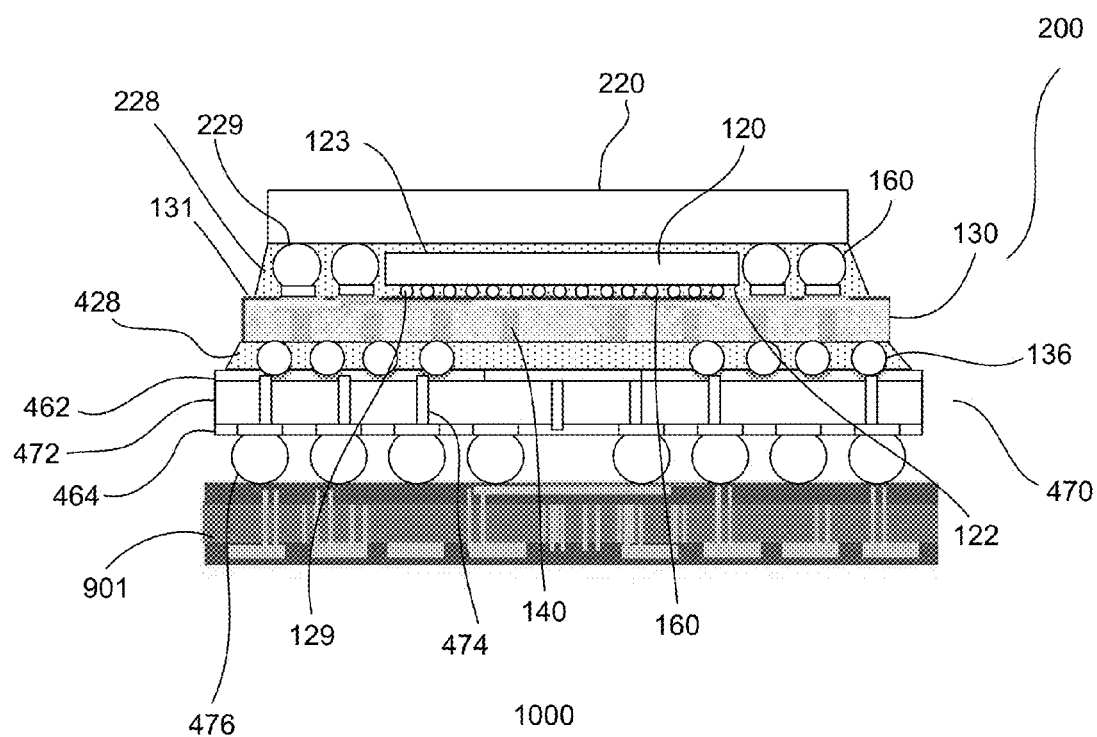

FIGS. 10a-10b illustrate one embodiment of a process 1000 for forming a semiconductor assembly 900. Referring to FIG. 10a, a singulated semiconductor assembly unit obtained from a singulation process as described in, for example, FIG. 8f is coupled to an external component, such as a circuit board 901. The singulated semiconductor assembly unit is attached and coupled to the external component using, for example, a reflow process. Alternatively, the singulated semiconductor assembly unit may also be attached and coupled to the external component using, for example, a non-reflow process, such as a thermal compression bonding process. The singulated semiconductor assembly unit comprises an interposer 130 with a first die 120 mounted on top being coupled to a package substrate 470. As such, common elements may not be described or described in detail. The package substrate 470 is attached to the top surface of the circuit board 901.

As shown in FIG. 10b, a second device 220 is mounted on the top interposer surface. The device contacts are coupled to top interposer contact pads in the second die attach region n one embodiment, one or more reflow processes may be performed to establish connections between the die, device and interposer and between the interposer and package substrate and between the package substrate and the circuit board. Alternatively, a combination of reflow processes and bonding process which includes a thermal compression bonding may be performed to establish connections between the various components as described earlier. Flux cleaning processes may also be employed as necessary. Underfill material may be provided as desired in the spaces between for example, the die, device, interposer surface, package substrate surface etc. as aforementioned in FIGS. 9a-9c.

The embodiments as described above include die and device which are arranged in vertical arrangement. It is understood that the die and device may be arranged in planar or side-by-side arrangement or a combination of planar and vertical arrangements as will be described below.

Figure 11A:
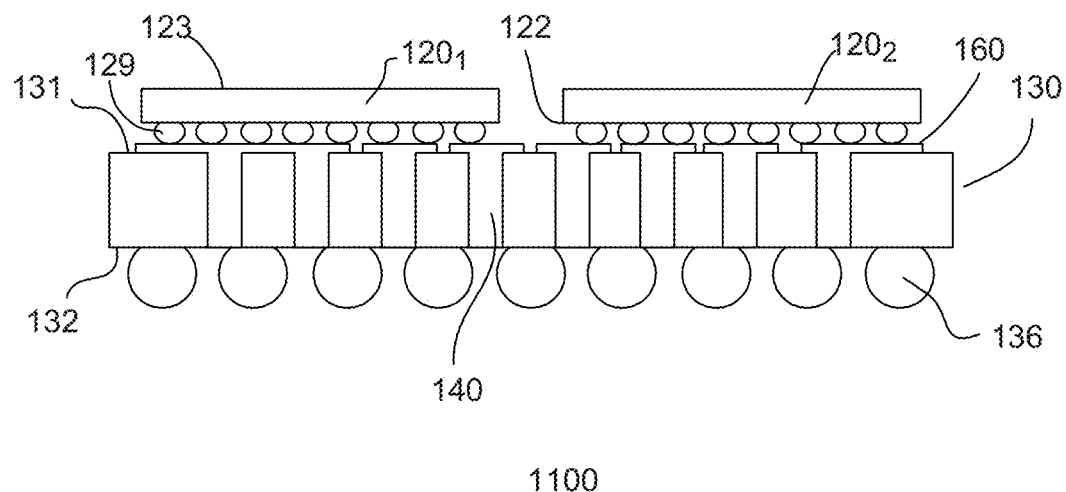
FIGS. 11a-11c show embodiments of semiconductor packages.
Figure 11B:
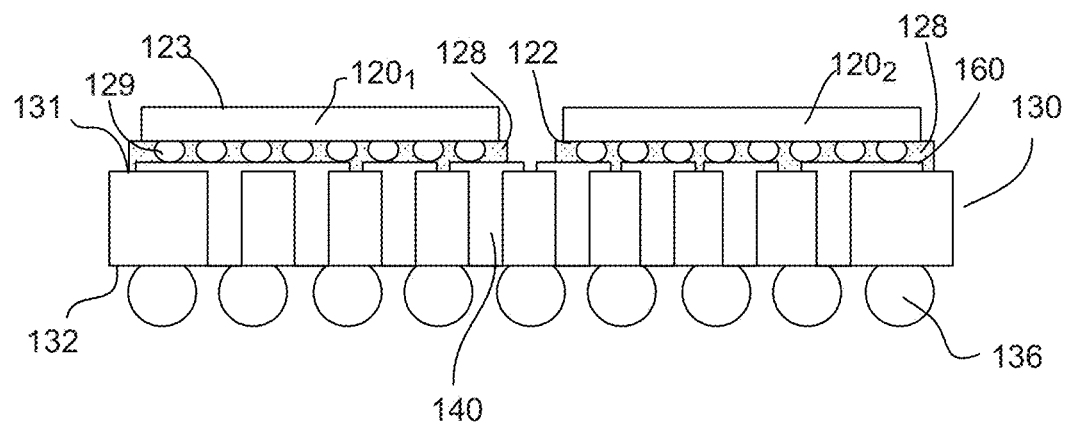
Figure 11C:
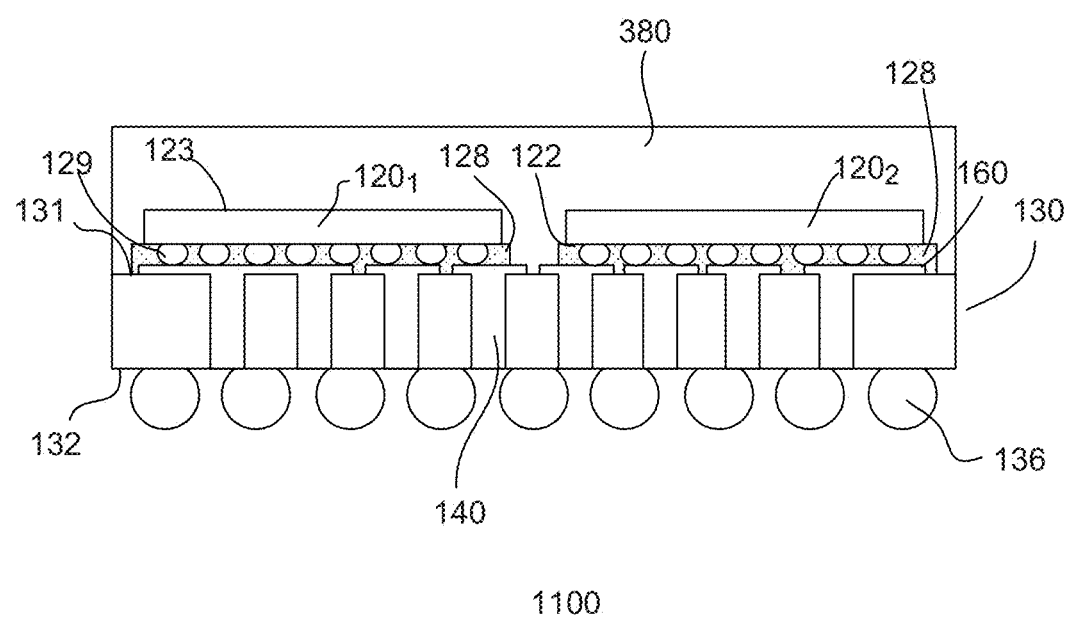

FIGS. 11a-11c show various embodiments of a semiconductor assembly 1100. The semiconductor assembly 1100 is similar to that described in FIGS. 1a-1b. As such, common features and features having the same reference numerals will not be further described in detail.

In one embodiment, the semiconductor assembly includes a plurality of dies arranged in a planar or side-by-side arrangement on the top surface of the interposer 130. For illustration purpose, first and second dies $120_1$ and $120_2$ are placed side-by-side on the die attach regions disposed on the top surface of the interposer. It is understood that other number of dies may be arranged side-by-side on the interposer. The first and second dies, for example, may include the same type of dies. The first and second dies, for example, are flip chips having die contacts 129 on an active surface. The die contacts 129 include the same material and form as the die contacts 129 described in FIGS. 1a-1b. As shown, the lateral dimensions of the first and second dies are the same. Alternatively, the first and second dies may include different types of dies and may include different sizes. For example, the first die may be larger than the second die or vice versa. Other suitable configurations for the dies may also be useful.

As shown, the mat of the first and second dies to the interposer leaves a space between the active surface of the die and top interposer surface. In one embodiment, the space may be left unfilled, as shown in FIG. 11a. In other embodiments, an underfill 128 is provided in the space between the active surface of the die and top interposer surface, as shown in FIG. 11b. The underfill, for example, may be a capillary underfill or a non-conductive paste which are described in FIGS. 1a-1b. The underfill, for example, may include an epoxy-based polymeric material. Other suitable types of underfill and underfill materials may also be useful.

Referring to FIG. 11c, the assembly 1100 may also include an encapsulant 380 which encapsulates the dies. For example, the encapsulant material may include the same material as that described in FIG. 3a. The encapsulant provides protection against the environment. As shown, the encapsulant covers the dies and top of the interposer. In other embodiments, the encapsulant may have a coplanar top surface with the surfaces of top dies (not shown). For example, the inactive surfaces of the dies are exposed.

Figure 12A:
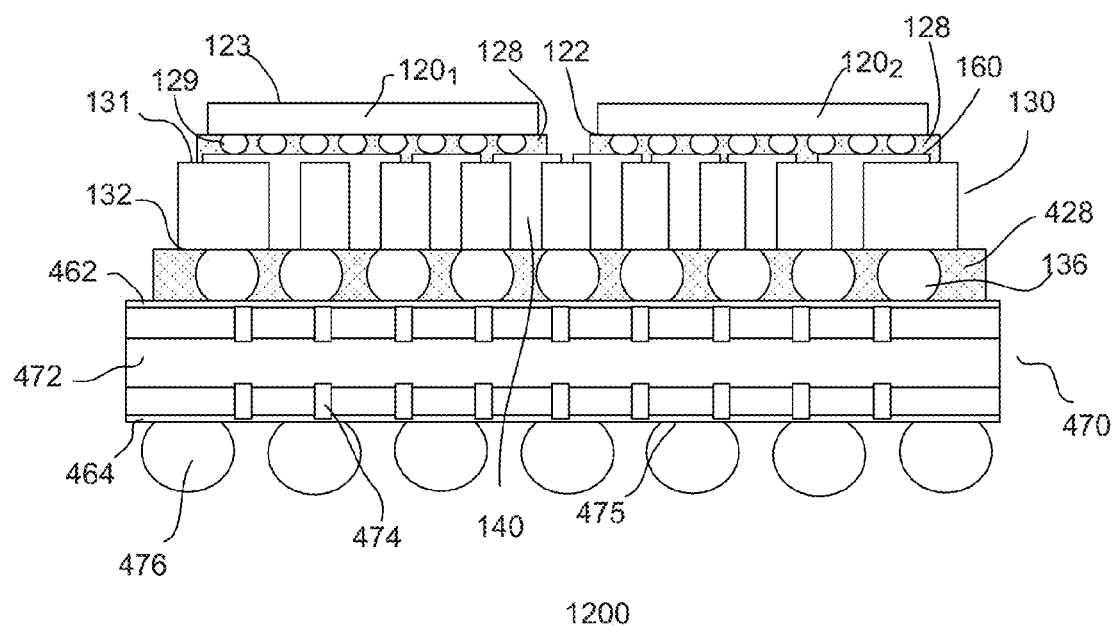
FIGS. 12a-12b show other embodiments of semiconductor packages.
Figure 12B:
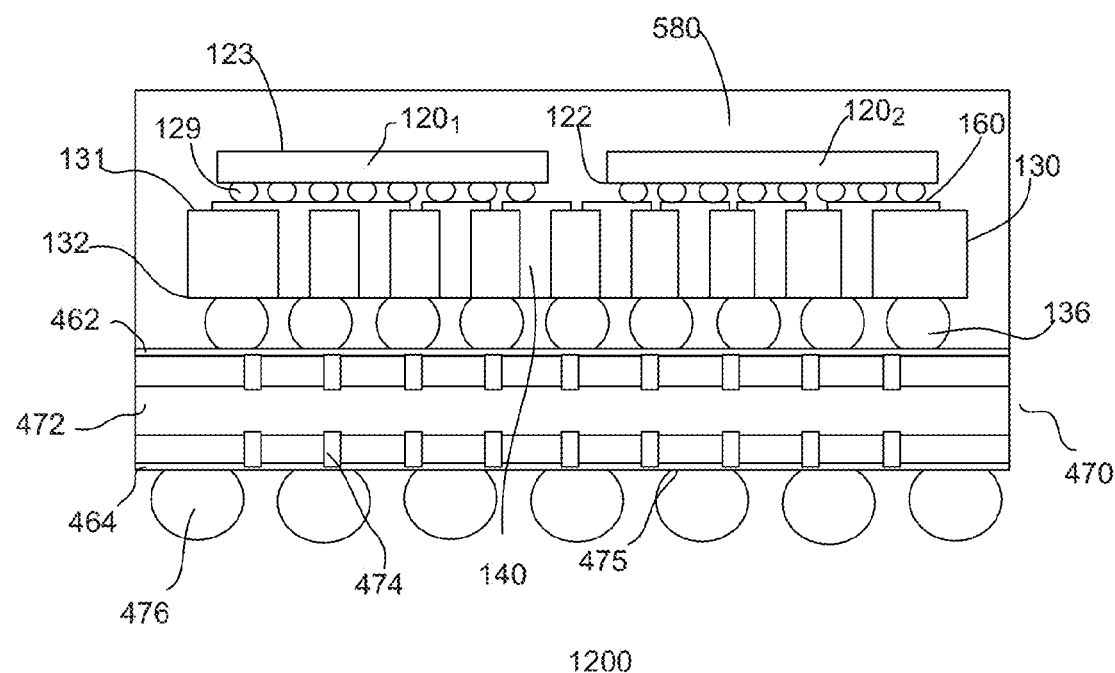

FIGS. 12a-12b show other embodiments of a package 1200. As shown, the package 1200 comprises of a semiconductor assembly and a package substrate. The semiconductor assembly is similar to that described in FIGS. 11a-11c. As such, common features and features with the same reference numerals will not be described in detail.

In one embodiment, package 1200 comprises a semiconductor assembly 1100 which is the same as that described in FIGS. 11a-11c mounted on top of a package substrate 470. Referring to FIG. 12a, the semiconductor assembly is provided on top of the package substrate 470. The package substrate 470, for example, is the same as the package substrate as described in FIG. 4a. As such, materials and layers of the package substrate will not be described.

An underfill 428 may be provided between the interposer and package substrate, as shown in, for example, FIG. 12a.

Alternatively, no underfill is provided between the interposer and package substrate and/or between the dies and the interposer. The underfill 428, for example, is the same underfill as that described in FIG. 4c. Other configurations of the underfill between the interposer and the package substrate as well as underfill between the dies and interposer may also be useful. In another embodiment, the package 1200 may also include an encapsulant 580. For example, the encapsulant material may include the same material as that described in FIG. 5a. The encapsulant provides protection against the environment. As shown in FIG. 12b, the encapsulant covers the dies, the interposer and top surface of the package substrate. In other embodiments, the encapsulant may have a coplanar top surface with the surfaces of top dies (not shown). For example, the inactive surfaces of the dies are exposed.

Figure 13A:
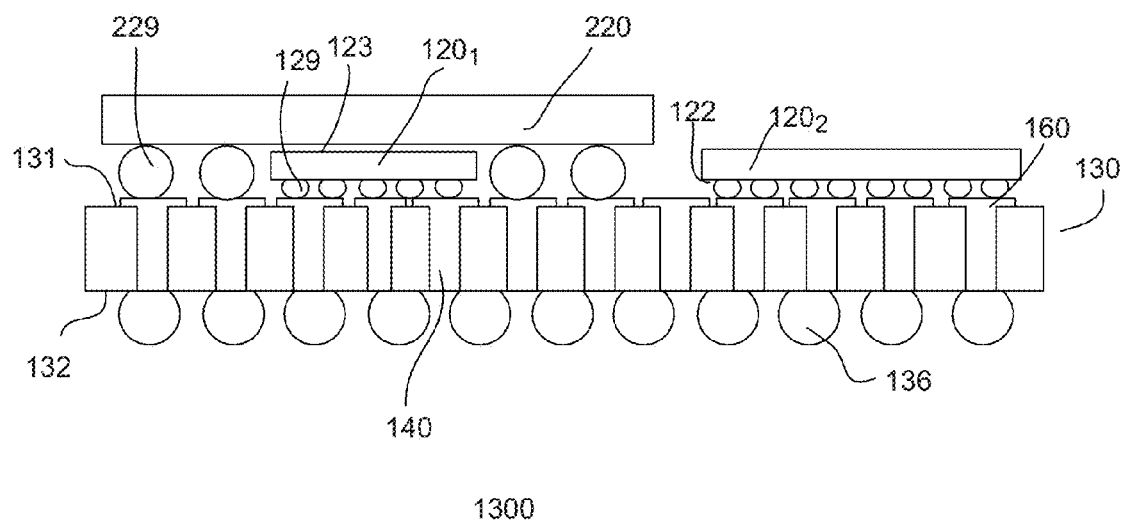
FIGS. 13a-13b show yet other embodiments of semiconductor packages.
Figure 13B:
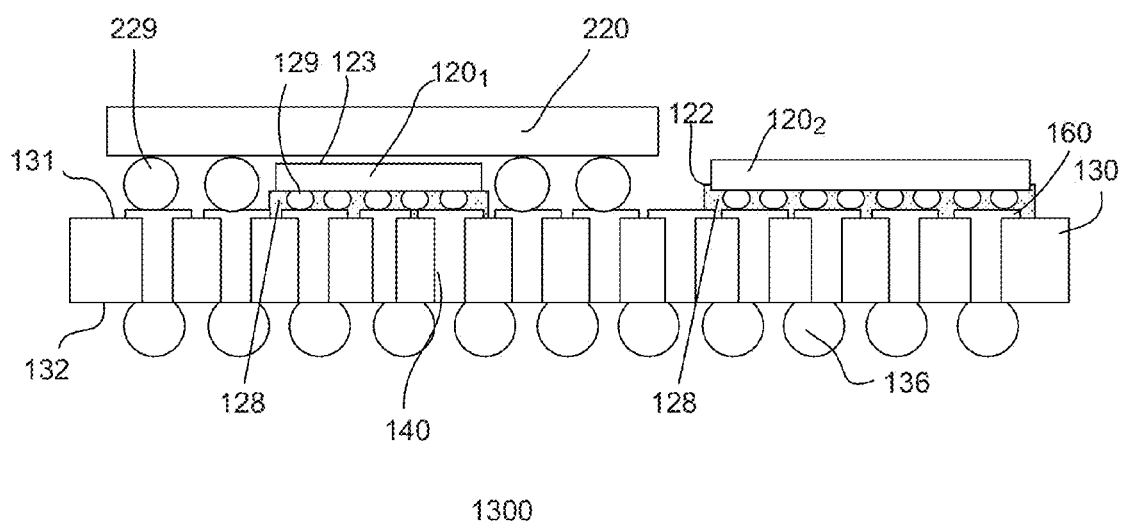

FIGS. 13a-13b show various embodiments of a semiconductor assembly 1300. The semiconductor assembly 1300 is similar to that described in FIGS. 2a-2b and FIGS. 11a-11b. As such, common features and features having the same reference numerals will not be further described in detail.

In one embodiment, the semiconductor assembly includes a plurality of dies arranged in a planar or side-by-side arrangement well as vertical arrangement on the top surface of the interposer 130. For illustration purpose, first and second dies 1201 and 1202 are placed side-by-side on the die attach regions disposed on the top surface of the interposer. It is understood that other number of dies may be arranged side-by-side on the interposer. The first and second dies, for example, may include the same or different type of dies and the first and second dies may be of the same or different sizes. The semiconductor assembly, in one embodiment, further includes a third device 220 provided over the first die $120_1$ and on the top surface of interposer 130. The third device 220, for example, is the same as the device 220 and includes device contacts 229 which are described in FIG. 2a. The device contacts of the third device, for example, are arranged in the periphery of the bottom surface of the third device to provide a space to accommodate the first die below. As shown, the third device is provided over the first die. It is understood that the third device may be provided over the second die instead of the first die. In another alternate embodiment, a fourth device (not shown) may also be provided over the second die. The fourth device may be provided over the second die in the same manner as the third device being provided over the first die. Other suitable configurations and arrangements of the dies and devices may also be useful.

As shown in FIG. 13a, no underfill is provided in the space between the dies and top interposer surface. In another embodiment, as shown in FIG. 13b, underfills 128 are provided in the space between the active surfaces of the first and second dies and top interposer surface, while no underfill is provided in the space between the third device and the top interposer surface. It is understood that an underfill (not shown) may be provided in the space between the third device and the top interposer surface. The underfill 128, for example, may be a capillary underfill or a non-conductive paste which has already been described in FIG. 1a and will not be described in detail.

In another embodiment, the assembly 1300 may also include an encapsulant (not shown) which encapsulates the dies and device. For example, the encapsulant material may include the same material as that described in FIG. 5a. The encapsulant provides protection against the environment. The encapsulant, for example, covers the dies, device and top of the interposer. In other embodiments, the encapsulant may have a coplanar top surface with the surfaces of top device (not shown), such as the top surface of the third device. For example, the top surface of the third device may be exposed.

Figure 14A:
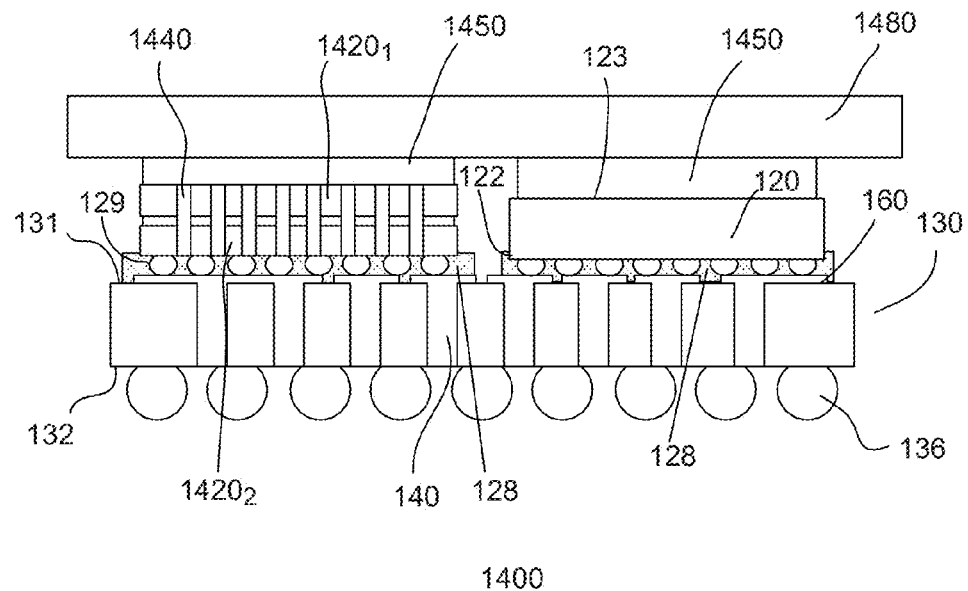
FIGS. 14a-14b show various other embodiments of semiconductor packages.
Figure 14B:
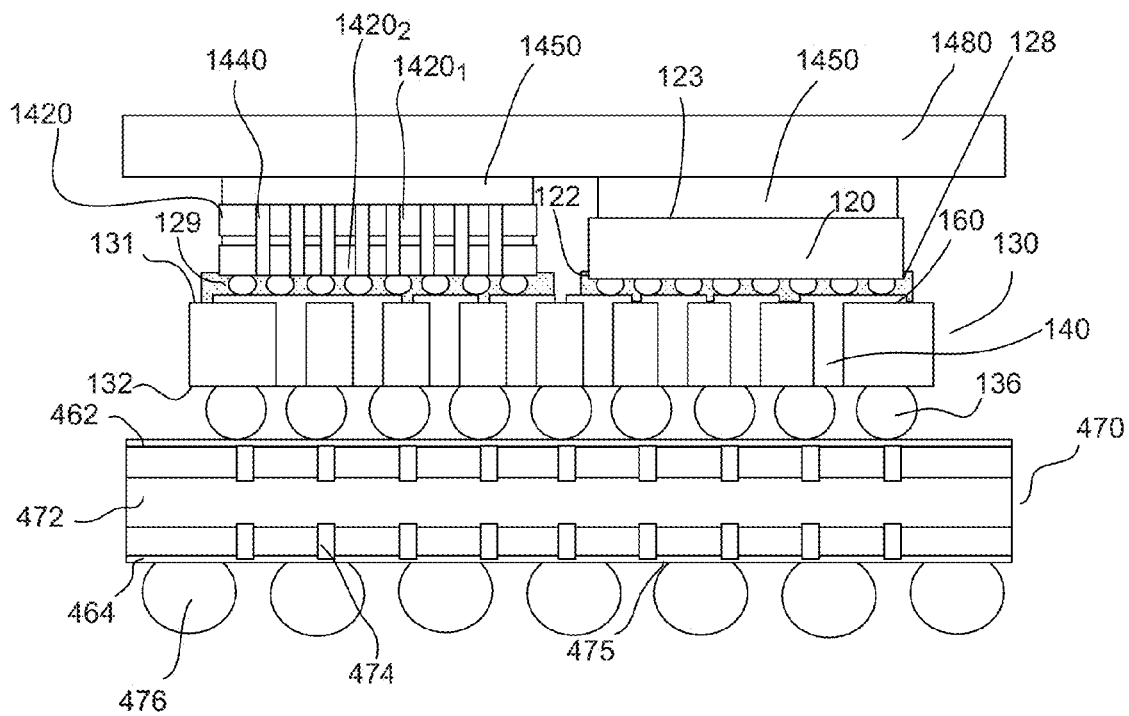

FIGS. 14a-14b show various embodiments of a semiconductor assembly 1400. The semiconductor assembly 1400 is similar to that described in FIGS. 11a-11b. As such, common features and features having the same reference numerals will not be further described in detail.

In one embodiment, the semiconductor assembly includes a die stack arranged a planar or side-by-side arrangement with a die 120. For example, a die stack 1420 having a plurality of dies are placed adjacent to a die 120 on the die attach regions disposed on the top surface of the interposer. For illustration purpose, the die stack includes first and second dies $1420_1$ and $1420_2$. It is understood that the die stack may include other number of dies. The first and second dies of the die stack, for example, may include the same or different type of dies and the first and second dies of the die stack may be of the same or different sizes.

The die stack, for example, may include a memory stack. For example, the first and second dies of the die stack may include a first memory die and a second memory die stacked on top of the first memory die. Other suitable types of dies may also be useful. The first and second dies of the die stack, for example, may be electrically connected to each other via through silicon vias (TSVs) 1440 and the dies may be stacked prior to attachment to the interposer. Alternatively, the first die $1420_1$ having die contacts 129 may be placed over the top interposer surface followed by stacking the second die $1420_2$ over the first die $1420_1$. The second die $1420_2$ may include die contacts which may be the same as die contacts of the first die or microbumps. The die con acts of the second die, for example, are electrically connected to the TSVs of the first die below. Other suitable connection arrangements between the dies of the die stack may also be useful.

The semiconductor assembly, in one embodiment, further includes a heat spreader 1480 provided over the die stack and the die 120. The heat spreader, for example, includes a conductive plate. The conductive plate is made of for example, copper. Other suitable material which effectively dissipates heat from the dies may also be used as the heat spreader. The heat spreader, for example, is attached to the top surfaces of the die stack and the die through a thermal interface material 1450. The thermal interface material, for example, includes thermally conductive adhesive. Other suitable materials which has low thermal resistance which allows for effective heat transmission from the dies to the heat spreader and enables bonding of the heat spreader to the top surfaces of the die stack and die may also be useful.

As shown in FIG. 14a, underfills 128 are provided he spaces between the die stack and top interposer surface and between the die and the top interposer surface. In another embodiment, no underfill is provided in the spaces between the die stack and the top interposer surface and between the die and the top interposer surface. In yet another embodiment, the assembly 1400 may also include an encapsulant (not shown) which encapsulates the die stack and the die. For example, the encapsulant material may include the same material as that described in FIG. 5a. The encapsulant may have a coplanar top surface with the surface of the heat spreader. For example, the top surface of the heat spreader may be exposed.

In another embodiment, the semiconductor assembly 1400 may be mounted on top of a package substrate 470 as shown in FIG. 14b. Referring to FIG. 14b, the package substrate 470, for example, is the same as the package substrate as described in FIG. 4a. As such, materials and layers of the package substrate will not be described. Underfill material may optionally be provided in the space between the interposer and the top package substrate surface. Details of the underfill will not be described in detail.

Although FIGS. 14a-14b show that a die stack is placed adjacent to the die 120, it is understood that the die 120 may be replaced with a second die stack. The second die stack may be the same or different than the first die stack 1420. Other suitable die configurations and arrangements may also be useful.

FIGS. 15a-15d show an embodiment of a process 1500 for forming a semiconductor assembly 1100. The process 1500 is similar to the process 600 as described in FIGS. 6a-6d. The process involves features or elements described in FIGS. 11a-11c above. Common process steps and features having the same reference numerals will not be described in detail. The process includes providing an interposer 130 having, for example, top and bottom surfaces 131 and 132. Die attach regions are defined on the top surface of the interposer on which one or more dies can be mounted thereon. Although only one interposer is shown, it is understood that the interposer may be provided as part of an interposer substrate which is prepared with a plurality of interposers as shown in FIG. 6a.

Figure 15A:
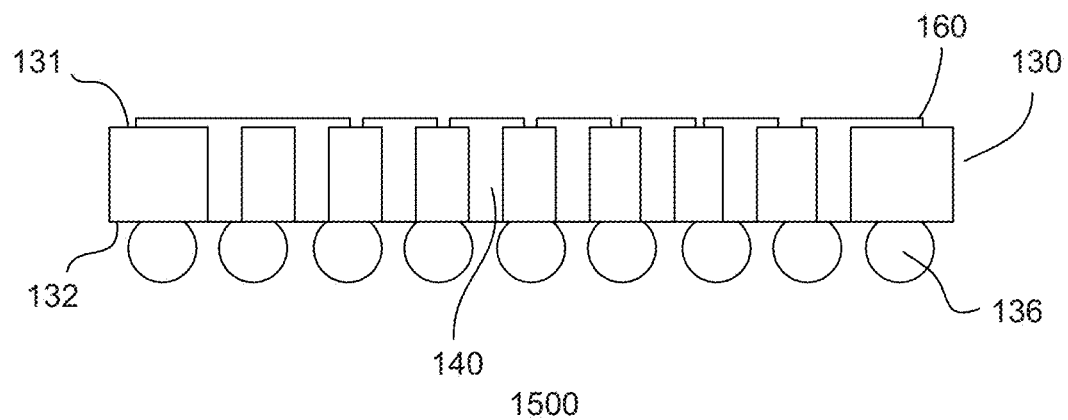
FIGS. 15a-15d show a process of forming a semiconductor package.

Referring to FIG. 15a, the top and bottom surfaces of the interposer are prepared with interposer contact pads 160, including solder lands for example. Additional external interposer contacts 136 are disposed onto the contact pads on the bottom surface of the interposer, which may be in the form of, but not limited to spherical shaped structures, balls or elongated structures. The external interposer contacts may be formed from a conductive material. For example, the contacts may be formed from solders, such as lead-based or non lead-based solders. Alternatively, the external interposer contacts, for example, may include conductive pillars, such as but not limited to Cu pillars having solder cap thereon. Other suitable conductive pillars and non-solder based conductive materials may also be used. The interposer substrate is further provided with through interposer vias 140 facilitating electrical coupling between the top and bottom interposer contact pads, and conductive traces allowing for re-routing of contact pads o desirable pattern arrangement.

Figure 15B:
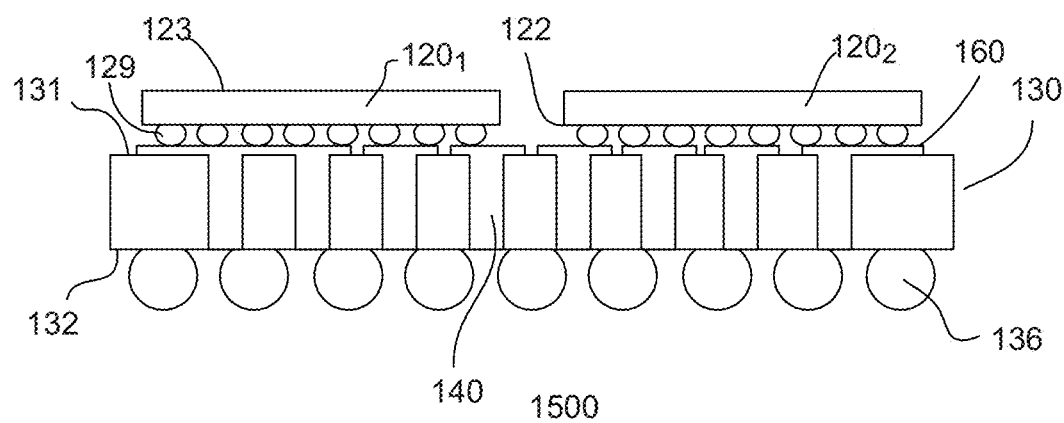

The process continues to provide a plurality of dies to the die attach regions on the interposer as shown in FIG. 15b. For illustration purpose, first and second dies $120_1$ and $120_2$ are attached to the die attach regions. It is understood that other number of dies may be attached to the top interposer surface. The dies, for example, are flip chips provided with external die contacts 129 disposed on active surfaces. In one embodiment the die contacts, are mated to the top interposer contact pads in the die attach regions, with the active surface of the dies facing the top surface of the interposer. For example, the dies are picked up using a pick-and-place machine, dipped into flux such that the external die contacts 129 are at least partially coated with flux and then attached onto the die attach regions. In one embodiment, the first and second dies are placed in a planar or side-by-side arrangement as shown in FIG. 15b.

In one embodiment, after the dies are attached to the die attach regions of the interposers, a reflow process is performed, forming connections between the dies and interposer. Depending on the type of flux used, a clean process may be performed to remove the flux.

In another embodiment, after the dies are placed on the die attach regions of the interposers, a bonding process is performed in a bonding tool to form connections between the dies and the interposers. The bonding process, in one embodiment, includes a thermal compression bonding process. The process parameters of the thermal compression bonding process are the same as that described in FIG. 6b. Other suitable bonding process which does not require a reflow process may also be used to form connections between the dies and the interposer.

Figure 15C:
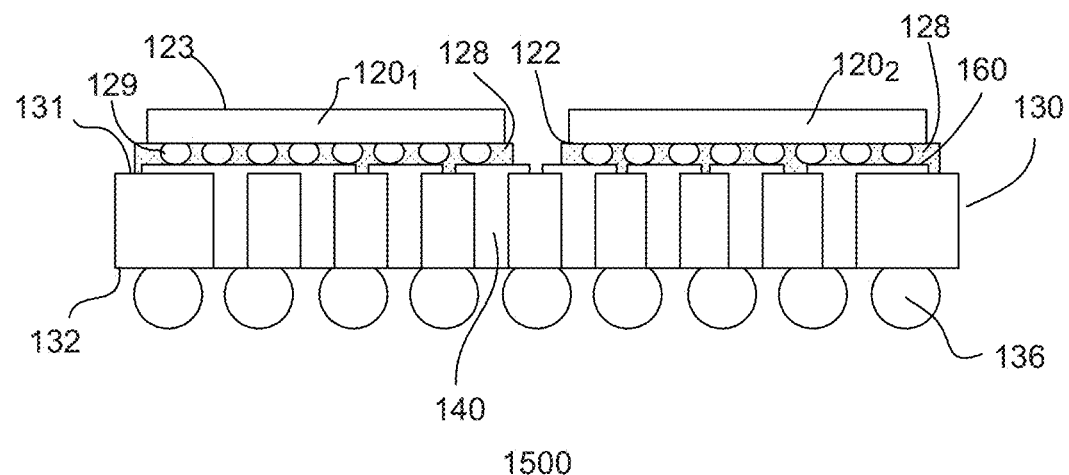

In FIG. 15c, an underfill 128 is dispensed into the space between the die and the top interposer surface, resulting in an interposer package which is the same as shown in FIG. 11b. In one embodiment, any suitable type of underfill may be used, including but not limited to capillary underfill, no-flow underfill, molded underfill for example. The capillary underfill, for example, fills the gaps between the die contacts and between the active surface of the dies and the top surface of the interposer through capillary action. The underfill, for example, may be an epoxy-based polymeric material. Other suitable underfill material may also be useful. The underfill may be partially or fully cured before the next process. In other embodiment, the step shown in FIG. 15c is skipped, resulting in an interposer package without underfill between the dies and interposer, as shown in FIG. 11a.

Figure 15D:
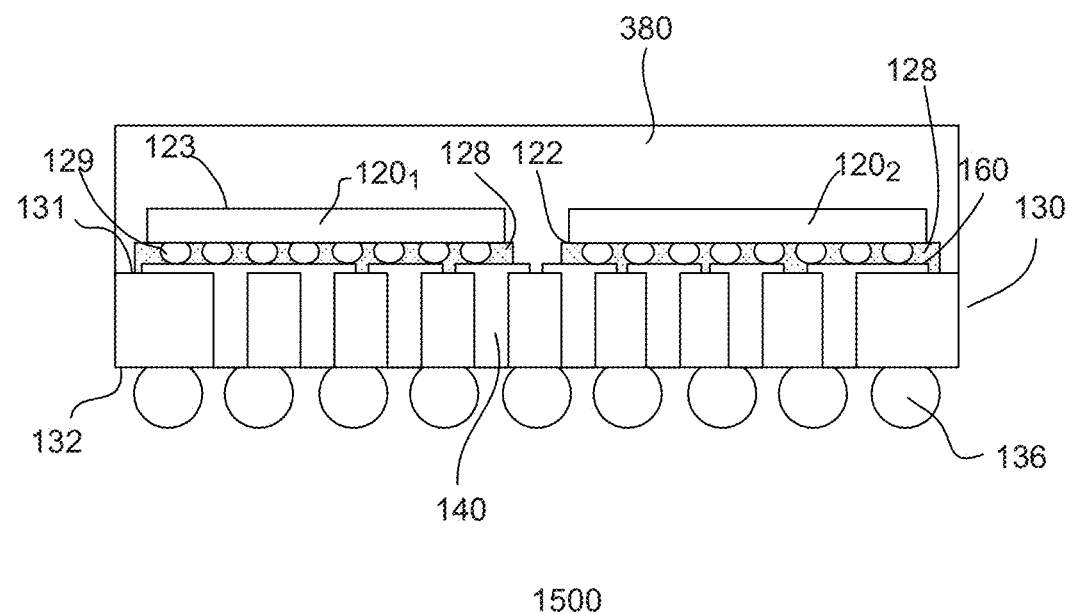

Referring to FIG. 15d, the process may continue to form an encapsulant 380 on the package substrate. The encapsulant 380 encapsulates the dies and top surface of the interposer. In one embodiment, the encapsulant covers the dies as shown in FIG. 15d. In other embodiment, the encapsulant may be coplanar with the top surfaces of the dies. The encapsulant may fill the spaces between the dies and the top surface of the interposer where no underfill is provided.

A singulation process is performed on the interposer substrate with the attached dies. The singulation process separates the interposers of the interposer substrate into individual semiconductor assemblies, such as the semiconductor assembly as shown in FIGS. 11a-11c.

Figure 16A:
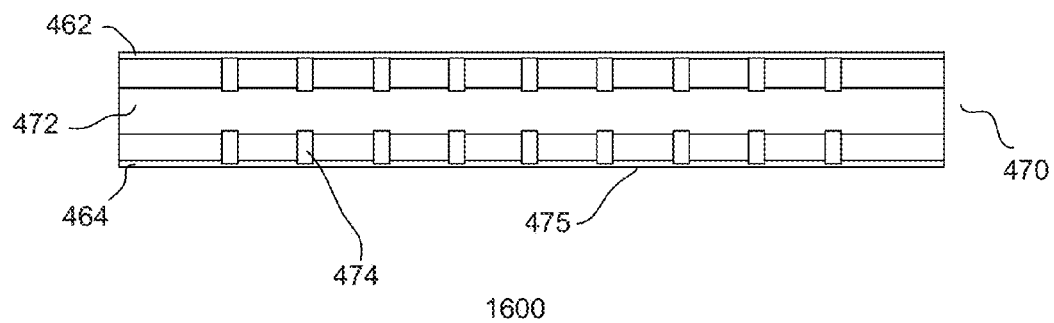
FIGS. 16a-16e show another process of forming a semiconductor package.
Figure 16B:
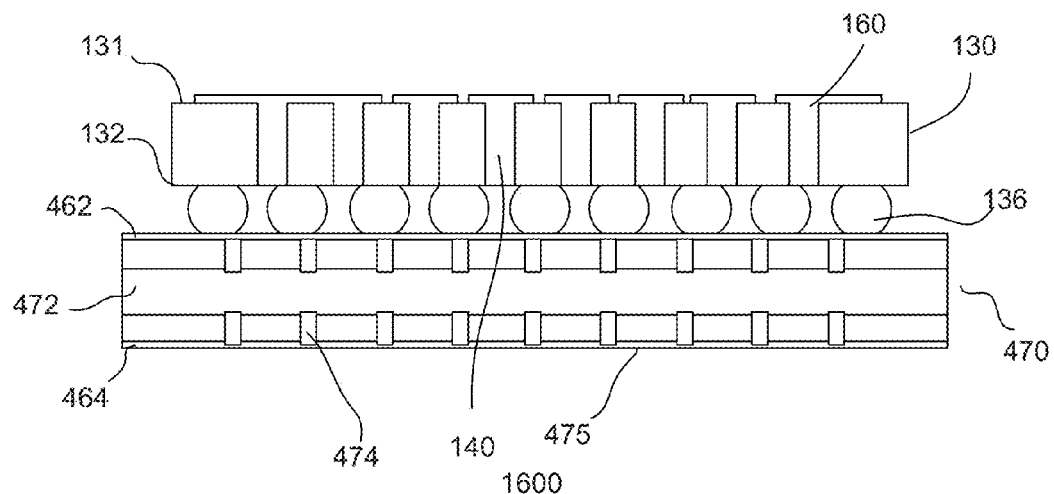

FIGS. 16a-16e show another embodiment of a process 1600 for forming a package 1200. The process 1600 is similar to the process as described in FIGS. 8a-8g and FIGS. 15a-15d. The process involves features or elements described in FIGS. 12a-12b above. Common process steps and features having the same reference numerals will not be described in detail. The process includes providing a package substrate 470 as shown in FIG. 16a. The package substrate is similar to that described in FIGS. 4a-4c. Although only one package substrate is shown, it is understood that the package substrate may be provided as part of a package substrate prepared with a plurality of package substrates as described in FIG. 8a. The package substrate, for example, includes a substrate layer 472 with first and second major surfaces and may further be provided with dielectric layers 462 and 464. The top substrate contact pads are coupled to the bottom substrate contact pads 475 by, for example, package substrate vias 474. The package substrate can be any type of substrates suitable for assembling of integrated circuit (IC) packages.

The process continues by providing one or more interposers 130 which are the same as that described in FIG. 15a. The one or more interposers are attached to the top substrate contact pad regions of the package substrate. For example, the interposer is picked up using a pick-and-place machine, dipped into flux such that the interposer contacts are at least partially coated with flux and then placed onto the top substrate contact pad region.

Figure 16C:
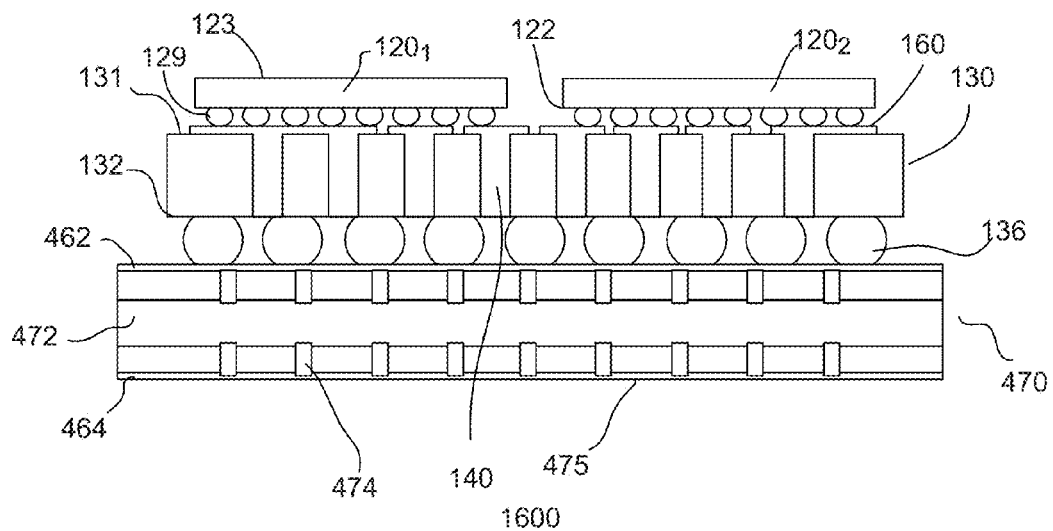

As shown in FIG. 16c, a plurality of dies are placed to die attach regions of the interposers by a suitable die attach process. In one embodiment, a reflow process may be performed, establishing the connections between the dies and interposers and between the interposers and the package substrate. In another embodiment, first and second bonding processes may be performed in a bonding tool to form connections between the dies and the interposers and between the interposers and the package substrate. In yet another embodiment, the connections between the dies to the interposer and between the interposer to the package substrate may be achieved by a combination of a bonding process, such as a they al compression bonding process, and a reflow process. These processes are the same as that described in FIG. 8c.

Figure 16D:
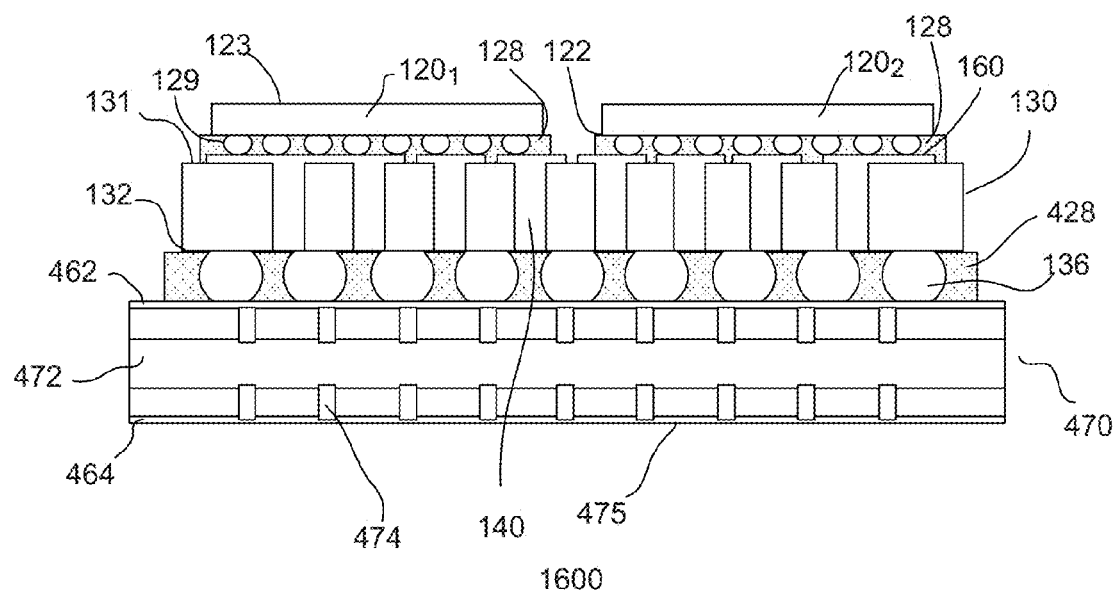

As shown in FIG. 16d, underfills 128 may be dispensed into the spaces between the dies and the top interposer surface. An underfill 428 is also dispensed into the space between the interposer and the package substrate. The underfill may be capillary underfill which is the same as that described in FIG. 15c. The spaces, for example, are filled with underfill material by capillary action. It is also possible that this step may be skipped, resulting in a package without underfill between the dies and the interposers and without underfill between the interposers and the package substrate. Alternatively, underfill may be provided in either the space between the interposer and the substrate or between the dies and the interposer.

Figure 16E:
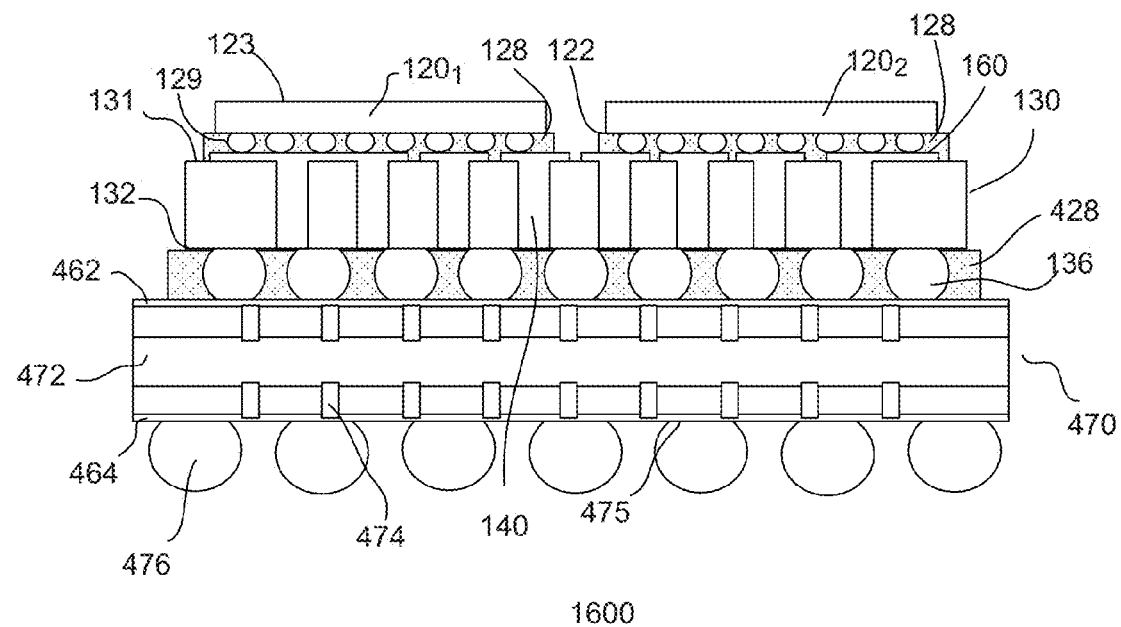

In FIG. 16e, external substrate contacts 476 are formed on the bottom surface of the package substrate. Prior to forming the external substrate contacts, an encapsulant may be formed on the package substrate. The encapsulant encapsulates the dies and interposers and top surface of the package subs rate resulting in a package similar to that described in FIG. 12b. A singulation process may be performed to separate the package substrates having semiconductor assemblies into individual packages.

Figure 17A:
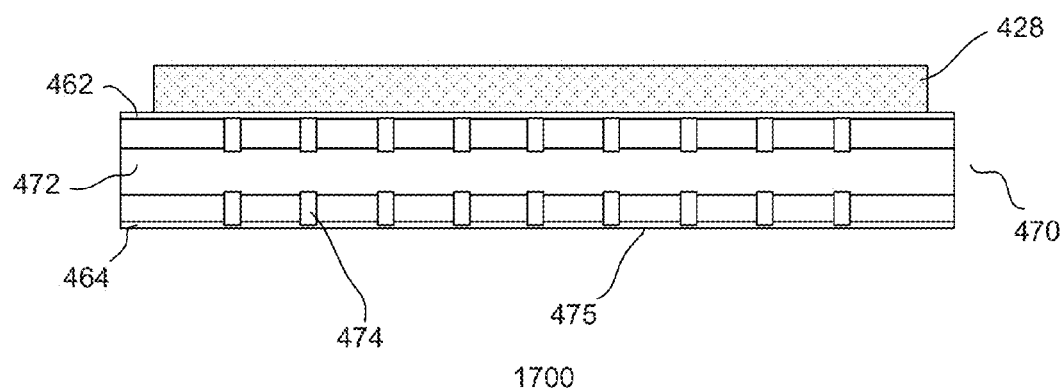
FIGS. 17a-17e show yet another embodiment of a method for forming a semiconductor package.

FIGS. 17a-17e show an alternate embodiment of a process 1700 for forming a package 1200. The process 1700 is similar to the process as described in FIGS. 8a-8g. FIGS. 15a-15d and FIGS. 16a-16e. The process involves features or elements described in FIGS. 12a-12b above. Common process steps and features having the same reference numerals will not be described in detail. The process includes providing a package substrate 470 as shown in FIG. 16a. In one embodiment, an underfill 428 is provided over the top surface of the package substrate as shown in FIG. 17a. The underfill 428, in one embodiment, is provided over the top surface of the package substrate prior to attachment of interposers thereon. The underfill material, in one embodiment, includes a non-conductive paste. The non-conductive paste, for example, includes an epoxy-based polymeric material and may be provided over the top package substrate surface using laminating, dispensing or spin coating technique. Other suitable non-conductive paste or underfill material and forming techniques may also be useful depending on the material of the underfill.

Figure 17B:
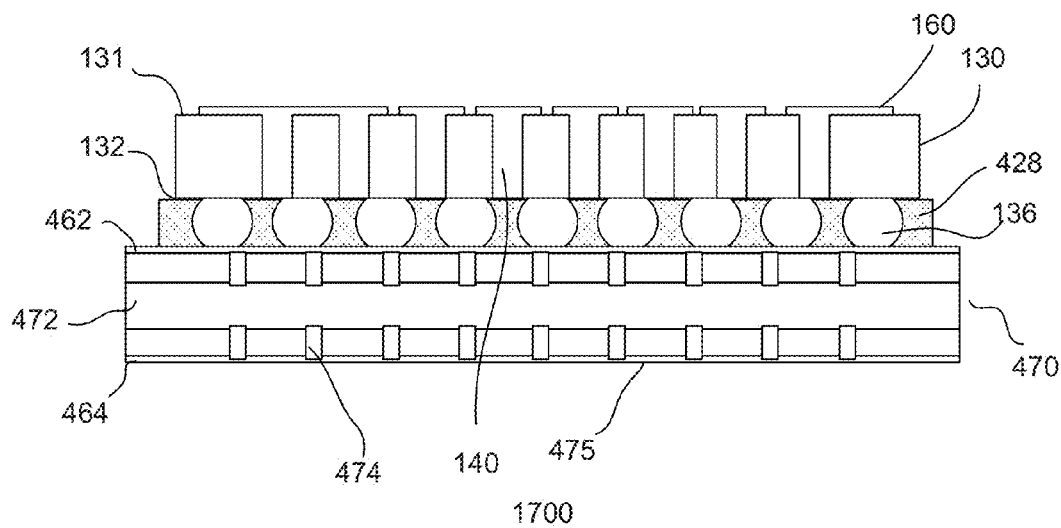

The process continues to provide one or more interposers on top of the package substrate as shown in FIG. 17b. The one or more interposers are attached to the top substrate contact pad regions of the package substrate. For example, the interposer is picked up using a pick-and-place machine and then placed onto the top substrate contact pad region. In one embodiment, a bonding process may be performed in a bonding tool to form connections between the interposers and the package substrate. The bonding process, for example, includes a thermal compression bonding process which is the same as that described in FIG. 8c. As shown, the interposer contacts penetrate through the underfill and are bonded to the contact pads on the substrate. The underfill 428, for example, is about 80-90% cured at the end of the thermal compression bonding process and no subsequent reflow process is required. Other suitable bonding process which does not require a reflow process may also be used to form connections between the interposers and the package substrate.

Figure 17C:
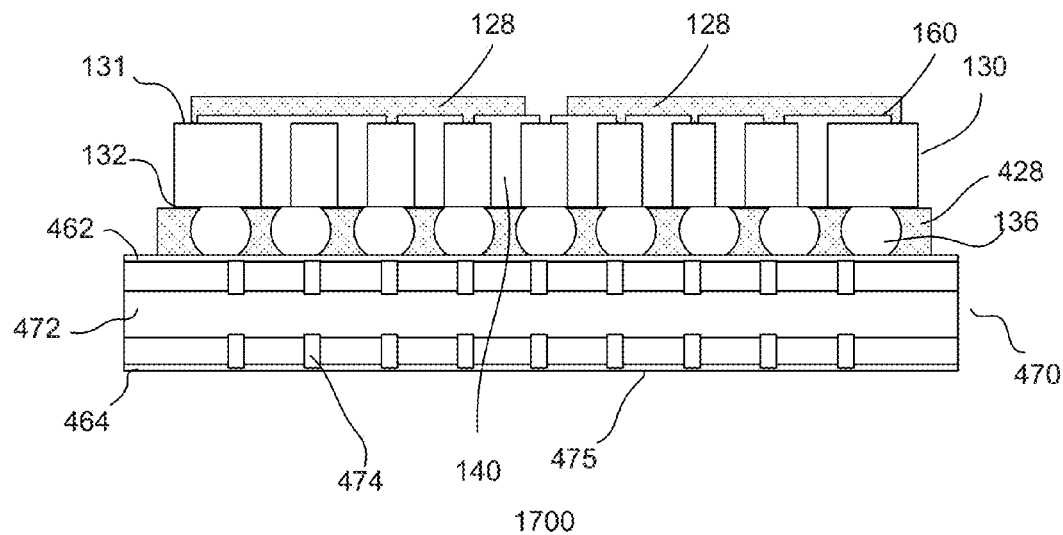

As shown in FIG. 17c, underfills 128 are provided over e die attach regions of the interposer. In one embodiment, the underfills 128 are provided over the top interposer surface prior to attachment of dies thereon. The underfills 128, as shown, at least cover the interposer contact pads. The underfill material, in one embodiment, includes a non-conductive paste. The non-conductive paste, for example, includes an epoxy-based polymeric material and may be provided over the top interposer surface using laminating, dispensing or spin coating technique. Other suitable non-conductive paste or underfill material and forming techniques may also be useful depending on the material of the underfill.

Figure 17D:
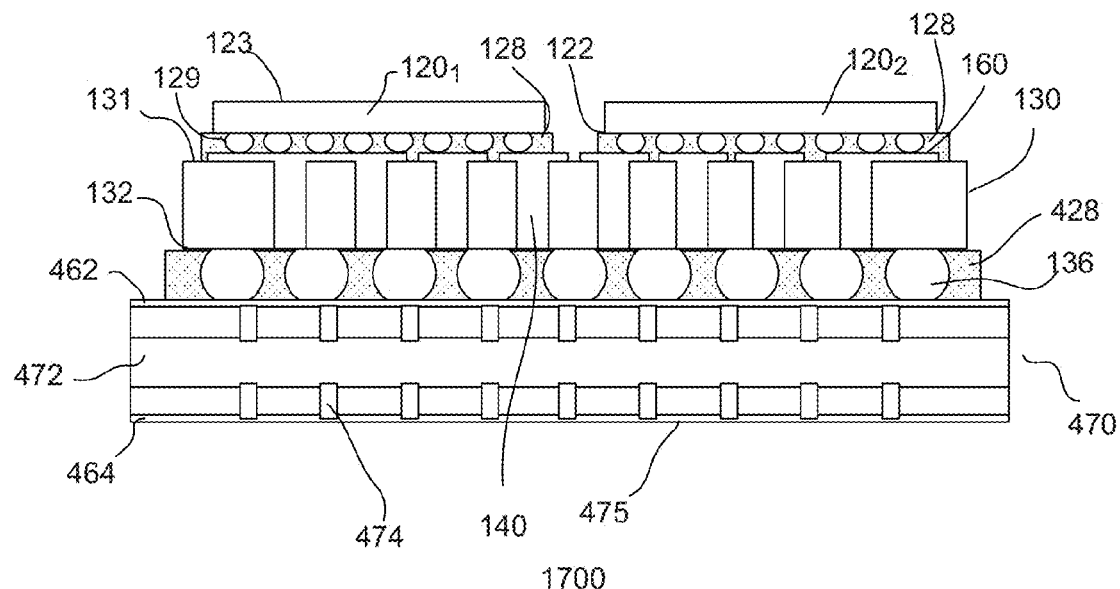

The process continues by providing a plurality of dies on the die attach regions of the interposers by a suitable die attach process as shown in FIG. 17d. In one embodiment, the dies are picked up using a pick-and-place machine and then placed onto the top interposer surface. In one embodiment, a bonding process may be performed in a bonding tool to form connections between the dies and the interposer. The bonding process, for example, includes a thermal compression bonding process which is the same as that described in FIG. 8c. As shown, the die contacts penetrate through the underfill 128 and are bonded to the contact pads on the interposer. The underfill 128, for example, is about 80-90% cured at the end of the thermal compression bonding process and no subsequent reflow process is required. Other suitable bonding process which does not require a reflow process may also be used to form connections between the dies and the interposer.

Figure 17E:
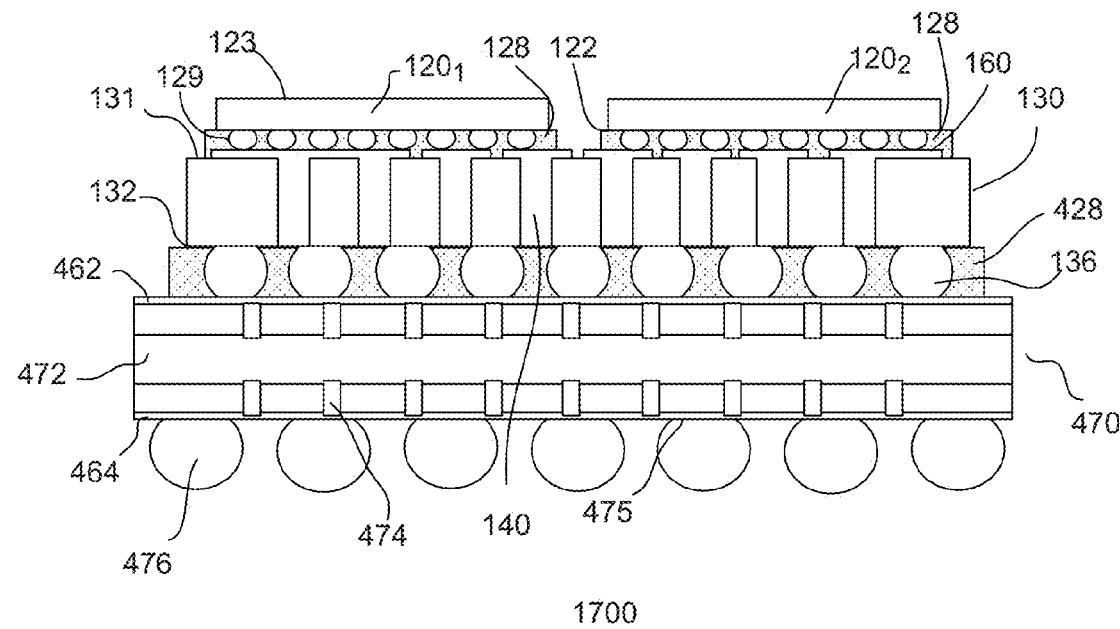

In FIG. 17e, external substrate contacts 476 are formed on the bottom surface of the package substrate and processes such as that described in FIG. 16e are performed. Details of these processes will not be described.

The methods as described in FIGS. 15a-15d, FIGS. 16a-16e and FIGS. 17a-17e show first and second dies being provided over the interposer. It is understood that the methods may be modified such that the semiconductor assembly includes a plurality of dies arranged in a planar or side-by-side arrangement as well as vertical arrangement on the top surface of the interposer. For example, the processes may be modified to further provide a third device 220 over the first die $120_1$ and on the top surface of interposer 130, resulting in a semiconductor assembly being the same or similar to that as shown in FIGS. 13a-13b. In addition, the processes may be modified such that one or more die stacks instead of individual dies are provided and arranged in a planar or side-by-side arrangement on the interposer. For example, the processes may be modified to provide at least a die stack 1420 adjacent to die, resulting in a semiconductor assembly being the same or similar to that as shown in ire FIGS. 14a-14b. Other suitable die configurations and arrangements may also be useful.

The embodiments as described in FIGS. 15a-15d, FIGS. 16a-16e and FIGS. 17a-17e result in advantages. For example, the processes are flexible as the dies may be of the same or different types and various die or interposer attach processes can be employed. In one of the examples, the die may be attached to the interposer or the interposer may be attached to the package substrate using a bonding process, such as but not limited to a thermal bonding process. The manufacturing process is simplified as the bonding process as described eliminates a reflow process. Furthermore, in some of the embodiments, the die or device contacts or interposer contacts include conductive pillars. The die contacts, device contacts or interposer contacts in the form of conductive pillars allow the pitch of the contacts to be smaller relative to contacts in the form of spherical shape or balls. Providing underfill materials prior to attachment of interposer or dies is particularly useful for dies or interposers having high input/output and fine pitch contacts. The underfill material, such as but rant limited to non-conductive paste, which is provided prior to attachment of the dies or interposers ensure that the gaps between the contacts and spaces between the opposing surfaces of various components sandwiching the contacts are completely filled with underfill material, improving reliability of the assembly or package. As such, the processes as described enable integration of various dies, devices or chips having different functions in the same package. The electrical performance of the assembly or package is enhanced and smaller form factor may be achieved based on the embodiments as described above. In addition, the interposer with through interposer vias enables attachment and electrical coupling of a die having very fine contact pitch to a package substrate having relatively larger contact pitch. Thus, the interposer effectively bridges the technology gap between the die and the package substrate.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that conic within the meaning and range of equivalency of the claims are intended to be embraced therein.

What is claimed is:

1. A method of forming semiconductor assemblies comprising:
    providing an interposer with through interposer vias, the interposer comprises a first surface and a second surface, wherein
        the through interposer vias extend from the first surface to the second surface of the interposer,
        the first and second surfaces of the interposer comprise interposer contact pads thereon, the through interposer vias facilitate electrical coupling between the interposer contact pads on the first and second surfaces of the interposer, and
        the second surface of the interposer comprises interposer contacts disposed thereon, the interposer contacts are configured to facilitate electrical coupling between the interposer contact pads and an external device;
    mounting at least a first die on at least one die attach region on the first surface of the interposer, the first die comprises a first surface with first conductive contacts thereon, wherein the interposer comprises material with coefficient of thermal expansion (CTE) similar to that of the first die, the first conductive contacts of the first die are coupled to the through interposer vias on the first surface of the interposer; and
    performing a bonding process which does not require a reflow process to form connections between the first die and interposer, wherein the bonding process comprises a thermal compression bonding process which comprises
        aligning and contacting the first conductive contacts with the interposer contact pads,
        elevating a temperature to be above a melting point of material of the first conductive contacts, and
        applying a bond force to the first die to form an intermetallic bond between the first conductive contacts and the interposer contact pads.

2. The method in claim 1 comprising providing an underfill into a space between the first die and the first surface of the interposer.

3. The method of claim 2 wherein the underfill comprises a non-conductive paste.

4. The method of claim 3 wherein the non-conductive paste is provided through lamination, dispensing or spin coating technique.

5. The method of claim 2 wherein the underfill is provided prior to mounting at least a first die.

6. The method in claim 1 comprising mounting a second die on a second die attach region on the first surface of the interposer.

7. The method of claim 6 wherein the first and second dies are mounted in a side-by-side arrangement.

8. The method of claim 7 wherein performing the bonding process form connections between the first and second dies and interposer.

9. The method of claim 6 comprising providing underfills into spaces between the first and second dies and the first surface of the interposer.

10. The method of 9 wherein the underfills are provided prior to mounting the first and second dies.

11. The method of claim 6 comprising providing a package substrate having first and second surfaces, the first surface of the package substrate comprises first substrate contact pads, wherein the interposer is mounted on the first surface of the package substrate and the first substrate contact pads contact the interposer contacts on the second surface of the interposer.

12. The method of claim 11 comprising performing a bonding process which does not require a reflow process to form connections between the interposer and package substrate.

13. The method of claim 11 comprising performing a reflow process to form connections between the interposer and package substrate.

14. The method of claim 6 wherein the interposer contacts comprises conductive pillars having solder cap thereon.

15. The method of claim 6 comprising mounting a third device over the first die on a third die attach region on the first surface of the interposer, wherein the third die attach region is disposed on a periphery of the first die attach region and the third device comprises a first surface with conductive contacts thereon which directly contact the interposer contact pads which are disposed on the third die attach region.

16. The method of claim 1 comprising mounting a die stack on a second die attach region on the first surface of the interposer, wherein the die stack and the first die are mounted in a side-by-side arrangement.

17. A semiconductor assembly comprising:
    an interposer with through interposer vias, the interposer comprises a first surface and a second surface, wherein
        the through interposer vias extend from the first surface to the second surface of the interposer,
        the first and second surfaces of the interposer comprise interposer contact pads thereon, the through interposer vias facilitate electrical coupling between the interposer contact pads on the first and second surfaces of the interposer, and
        the second surface of the interposer comprises interposer contacts disposed thereon, the interposer contacts are configured to facilitate electrical coupling between the interposer contact pads and an external device;
    at least first and second dies on first and second die attach regions on the first surface of the interposer, wherein the first and second dies are mounted in a side-by-side arrangement and the dies comprise a first surface with conductive contacts thereon, wherein the interposer comprises material with CTE similar to that of the dies, the conductive contacts of the dies are coupled to the through interposer vias on the first surface of the interposer; and a third die disposed over the first die on a third die attach region on the first surface of the interposer, wherein the third die attach region is disposed on a periphery of the first die attach region and the third die comprises a first surface with conductive contacts thereon which directly contact the interposer contact pads which are disposed on the third die attach region.

* * * * *